United States Patent
Yin

(10) Patent No.: US 12,463,624 B2
(45) Date of Patent: Nov. 4, 2025

(54) SLEW-RATE CONTROL CIRCUIT AND SLEW-RATE CONTROL METHOD

(71) Applicants: Institute of Integrated Circuits, Henan Academy of Sciences, Zhengzhou (CN); Yellow River Electronic Technology Co., Ltd., Zhengzhou (CN)

(72) Inventor: Ningchun Yin, Zhengzhou (CN)

(73) Assignees: Institute of Integrated Circuits, Henan Academy of Sciences, Zhengzhou (CN); Yellow River Electronic Technology Co., Ltd., Zhengzhou (CN)

( * ) Notice: Subject to any disclaimer, the term of this patent is extended or adjusted under 35 U.S.C. 154(b) by 65 days.

(21) Appl. No.: 18/617,644

(22) Filed: Mar. 26, 2024

(65) Prior Publication Data

US 2025/0202462 A1   Jun. 19, 2025

(30) Foreign Application Priority Data

Dec. 15, 2023   (CN) .......................... 202311729087.1

(51) Int. Cl.
*H03K 5/12*   (2006.01)
*G06F 1/30*   (2006.01)
(Continued)

(52) U.S. Cl.
CPC ................ *H03K 5/12* (2013.01); *G06F 1/30* (2013.01); *H03K 3/037* (2013.01); *H03K 19/20* (2013.01); *H03K 19/21* (2013.01)

(58) Field of Classification Search
CPC ............ H03K 5/04; H03K 17/00; H03K 5/00; H03K 5/05; H03K 5/24; H03K 17/165;
(Continued)

(56) References Cited

U.S. PATENT DOCUMENTS 5,339,078 A * 8/1994 Vernon ............ H03K 17/04106
327/427
5,883,531 A * 3/1999 Kuo ................ H03K 19/018585
327/437

(Continued)

FOREIGN PATENT DOCUMENTS

| CN | 108735254 A * | 11/2018 | ......... H03K 5/00006 |
| EP | 3934096 A1 * | 1/2022 | ............... H03K 5/01 |
| JP | 2013017078 A * | 1/2013 | ........... H03K 17/164 |

*Primary Examiner* — Lincoln D Donovan
*Assistant Examiner* — James G Yeaman
(74) *Attorney, Agent, or Firm* — MATTHIAS SCHOLL P.C.; Matthias Scholl

(57) ABSTRACT

A slew-rate control circuit, including: a proportional calculation circuit, which generates a first indicating voltage according to a plurality of adjusted first signals within a previous preset period and a plurality of first signals within a current preset period, and generates a second indicating voltage according to the plurality of adjusted first signals within the previous preset period and a plurality of second signals that are inverted from the plurality of first signals within the current preset period; a logic operation circuit, which generates an operation result according to a relationship between the first indicating voltage, and first and second reference voltages, and a relationship between the second indicating voltage, and the first and second reference voltages; and an output adjustment circuit, which determines whether to invert the multiple first signals within the current preset period according to the operation result.

20 Claims, 8 Drawing Sheets

(51) Int. Cl.
*H03K 3/037* (2006.01)
*H03K 19/20* (2006.01)
*H03K 19/21* (2006.01)

(58) Field of Classification Search
CPC .. H03K 5/01; H03K 5/12; H03K 5/13; H03K 17/145; H03K 17/167; H03K 17/56; H03K 19/018521; H03K 19/09429; H03K 3/017; H03K 3/0377; H03K 4/94; H03K 5/131; H03K 5/1565; H03K 17/22; H03K 17/223; H03K 17/30; H03K 19/00361; H03K 19/018507; H03K 2005/00052; H03K 3/356113; H03K 4/06; H03K 5/08; H03K 5/19; H03K 3/037; H03K 19/20; H03K 19/21; G06F 1/30
See application file for complete search history.

(56) References Cited

U.S. PATENT DOCUMENTS

| | | | |
|---|---|---|---|
| 6,097,222 A * | 8/2000 | Lovett | H03K 19/0948 |
| | | | 327/170 |
| 6,377,103 B1 * | 4/2002 | Mooney | H03K 5/13 |
| | | | 327/276 |
| 10,348,282 B1 * | 7/2019 | Lesso | H03M 1/508 |
| 2003/0042932 A1 * | 3/2003 | Bales | H03K 17/08122 |
| | | | 326/63 |
| 2020/0076412 A1 * | 3/2020 | Rajendra | H03K 5/134 |
| 2022/0404305 A1 * | 12/2022 | Kantack | G06F 1/10 |
| 2023/0102952 A1 * | 3/2023 | Tsai | H03K 5/24 |
| | | | 327/170 |
| 2023/0178141 A1 * | 6/2023 | Akamatsu | H03K 19/018521 |
| 2023/0378945 A1 * | 11/2023 | Shook | H03K 5/08 |

* cited by examiner

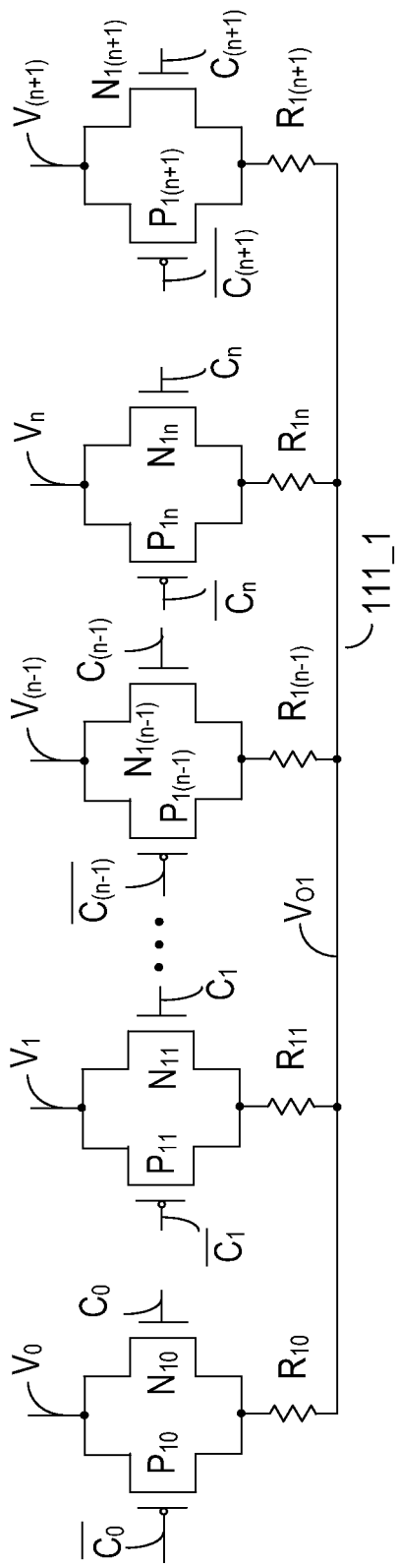
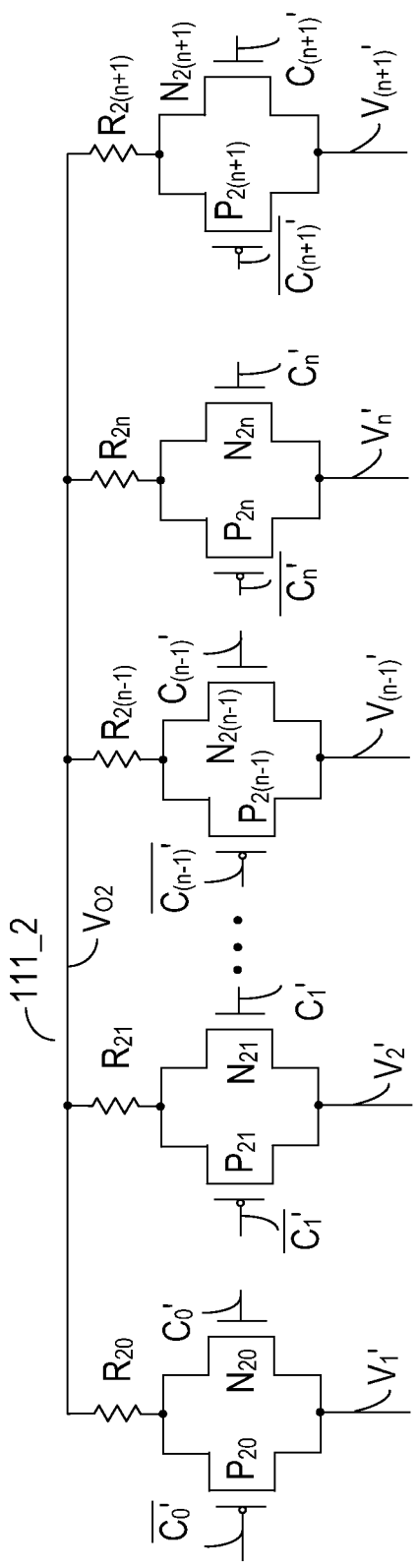
FIG. 6A
FIG. 6B

SLEW-RATE CONTROL CIRCUIT AND SLEW-RATE CONTROL METHOD

CROSS-REFERENCE TO RELATED APPLICATIONS

Pursuant to 35 U.S.C. § 119 and the Paris Convention Treaty, this application claims foreign priority to Chinese Patent Application No. 202311729087.1 filed Dec. 15, 2023, the contents of which, including any intervening amendments thereto, are incorporated herein by reference. Inquiries from the public to applicants or assignees concerning this document or the related applications should be directed to: Matthias Scholl P. C., Attn.: Dr. Matthias Scholl Esq., 245 First Street, 18th Floor, Cambridge, MA 02142.

BACKGROUND

The disclosure relates to the field of electronic circuits, and more specifically, to a slew-rate control circuit and a slew-rate control method.

A signal output circuit of a chip is mainly responsible for converting internal signals of the chip into voltage or current signals available for external devices. The voltage or current signals are transmitted to the external devices through physical connections. During this transmission process, voltage fluctuations (for example, decrease and/or increase in voltage) usually occur in the power network, and the voltage fluctuations will reduce the quality (for example, affecting a transmission time, causing oscillations, increasing or decreasing a slew rate) of the transmitted signals. If multiple signals have a relatively wide slew rate range, external receivers will need a longer time to receive all these multiple signals. At the same time, an excessively high slew rate will also cause overshoot and undershoot, thereby increasing power consumption. In addition, when the signal output circuit of the chip outputs multiple signals, if between any two adjacent moments, the number of signals that transition from a high level to a low level is basically equal to the number of signals that transition from a low level to a high level, the slew rate range of these multiple signals will be narrower; if between any two adjacent moments, the number of signals that transition from a high level to a low level is significantly different from the number of signals that transition from a low level to a high level, the slew rate range of these multiple signals will be wider, which will also increase the power consumption of the signal output circuit.

SUMMARY

A first aspect of the disclosure provides a slew-rate control circuit. The circuit includes: a proportional calculation circuit, configured to parallelly receive a plurality of first signals within a current preset period, generate a first indicating voltage according to a plurality of adjusted first signals within a previous preset period and the plurality of first signals within the current preset period, and generate a second indicating voltage according to the plurality of adjusted first signals within the previous preset period and a plurality of second signals that are inverted from the plurality of first signals within the current preset period; the first indicating voltage indicates a first numerical relationship between the number of low-level adjusted first signals within the previous preset period that respectively transition into high-level first signals within the current preset period, and the number of high-level adjusted first signals within the previous preset period that respectively transition into low-level first signals within the current preset period, and the second indicating voltage indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period; a logic operation circuit, coupled to the proportional calculation circuit, configured to receive the first indicating voltage and the second indicating voltage, and generate an operation result according to a numerical relationship between the first indicating voltage, and first and second reference voltages, and a numerical relationship between the second indicating voltage, and the first and second reference voltages; the first reference voltage is greater than the second reference voltage; and an output adjustment circuit, coupled to the logic operation circuit; the output adjustment circuit is configured to receive the operation result, and determine whether to invert the plurality of first signals within the current preset period to correspondingly generate a plurality of adjusted first signals within the current preset period according to the operation result.

A second aspect of the disclosure provides a slew rate control method. The method includes obtaining, using a proportional calculation circuit, a plurality of first signals within a current preset period, a plurality of adjusted first signals within a previous preset period, and a plurality of second signals that are inverted from the plurality of first signals within the current preset period; generating, using a proportional calculation circuit, a first indicating voltage according to the plurality of adjusted first signals within the previous preset period and the plurality of first signals within the current preset period, and generating a second indicating voltage according to the plurality of adjusted first signals within the previous preset period and the plurality of second signals within the current preset period; the first indicating voltage indicates a first numerical relationship between a number of low-level adjusted first signals within the previous preset period that respectively transition into high-level first signals within the current preset period, and a number of high-level adjusted first signals within the previous preset period that respectively transition into low-level first signals within the current preset period and the second indicating voltage indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period; generating, using a logic operation circuit, an operation result according to a numerical relationship between the first indicating voltage, and first and second reference voltages, and a numerical relationship between the second indicating voltage, and the first and second reference voltages, where the first reference voltage is greater than the second reference voltage; and determining, using an output adjustment circuit, whether to invert the plurality of first signals within the current preset period to correspondingly generate a plurality of adjusted first signals within the current preset period according to the operation result.

A third aspect of the disclosure provides a slew-rate control system. The system includes: a slew-rate control circuit, configured to parallelly receive a plurality of first signals within a current preset period, determine whether to invert the plurality of first signals within the current preset period to generate a plurality of adjusted first signals within the current preset period, according to a level relationship between a level state of each adjusted first signal in a previous preset period and a level state of a corresponding first signal in the current preset period, and a level relationship between a level state of each adjusted first signal in the previous preset period and a level state of a corresponding second signal in the current preset period; a plurality of second signals are obtained by inverting the plurality of first signals within the current preset period; and a signal output circuit, coupled to the slew-rate control circuit, configured to parallelly output multiple adjusted first signals within the current preset period.

BRIEF DESCRIPTION OF THE DRAWINGS

FIG. 6A shows another circuit diagram of a first proportional calculation subcircuit and FIG. 6B shows another circuit diagram of a second proportional calculation subcircuit according to another embodiment of the disclosure.

DETAILED DESCRIPTION

Figure 1:
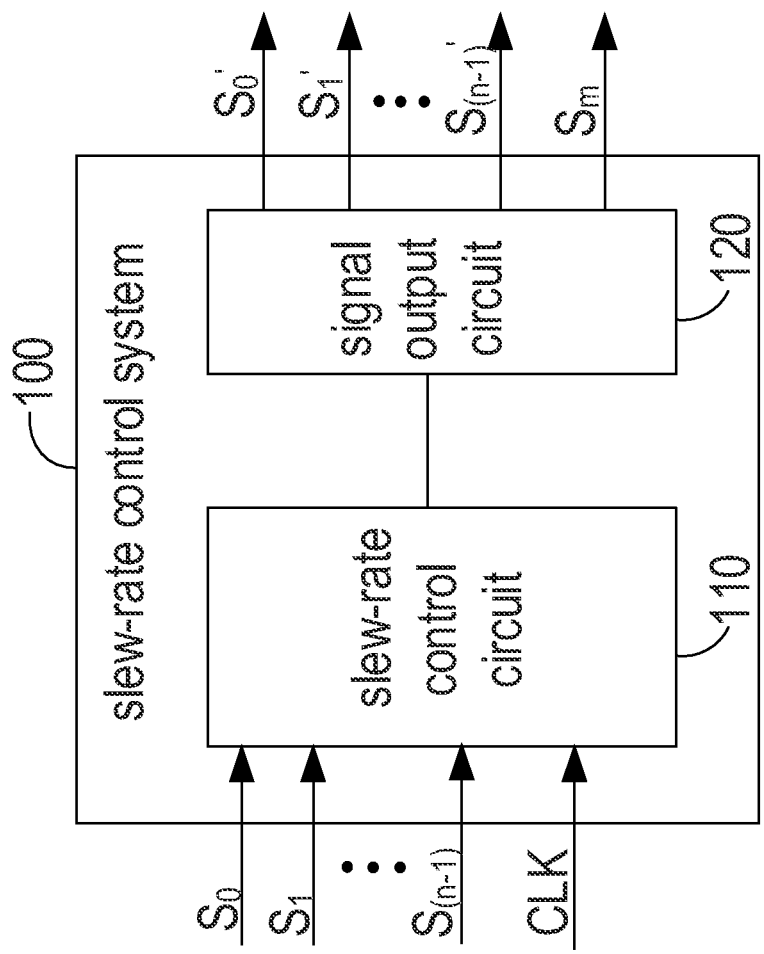
FIG. 1 shows a block diagram of a slew-rate control system according to an embodiment of the disclosure.

To further illustrate the disclosure, embodiments detailing a slew-rate control circuit and a slew-rate control method are described below. It should be noted that the following embodiments are intended to describe and not to limit the disclosure.

Furthermore, in the following detailed description of the disclosure, numerous specific details are set forth in order to provide a thorough understanding of the disclosure. However, it will be recognized by one of ordinary skill in the art that the disclosure may be practiced without these specific details. In other instances, well known methods, procedures, components, and circuits have not been described in detail as not to unnecessarily obscure aspects of the disclosure. The terms "connection", "connected", "coupled" and similar terms involved in the disclosure are not limited to physical or mechanical connections, but can include electrical connections, whether direct or indirect.

A signal output circuit of a chip is mainly responsible for converting internal signals of the chip into voltage or current signals available for external devices. If a slew rate range of multiple signals output from the signal output circuit is relatively wide, the power consumption of the signal output circuit will increase. In the disclosure, the slew-rate control circuit can adjust the multiple signals to obtain multiple adjusted signals, so that the slew rate range of the multiple adjusted signals is within a preset slew rate range, thereby reducing power consumption.

In the disclosure, the multiple signals input to the slew-rate control circuit are multiple first signals $S_0, S_1, \ldots, S_{(n-1)}$ to be output; the multiple second signals $S_{0\_0}, S_{1\_1}, \ldots, S_{(n-1)\_(n-1)}$ are obtained by inverting the multiple first signals $S_0, S_1, \ldots, S_{(n-1)}$ within a current preset period; the slew-rate control circuit adjusts the multiple first signals $S_0, S_1, \ldots, S_{(n-1)}$ and generates multiple adjusted first signals $S_0', S_1', \ldots, S_{(n-1)}'$. It can be understood that the slew-rate control circuit can adjust the multiple first signals within each preset period to obtain the multiple adjusted first signals $S_0', S_1', \ldots, S_{(n-1)}'$ within a corresponding preset period. In an embodiment, the multiple first signals $S_0, S_1, \ldots, S_{(n-1)}$, the multiple adjusted first signals $S_0', S_1', \ldots, S_{(n-1)}'$, and the multiple second signals $S_{0\_0}, S_{1\_1}, \ldots, S_{(n-1)\_(n-1)}$ are all strings of digital sequences composed of logic "0" or "1".

In the disclosure, the resistance values of resistors in all embodiments can be equal or unequal to each other. For ease of description, the resistance values of resistors $R_{10}, R_{11}, \ldots, R_{1n}, R_{1(n+1)}$, and the resistance values of resistors $R_{20}, R_{21}, \ldots, R_{2n}, R_{2(n+1)}$ in all embodiments of the disclosure are all equal, i.e., the resistance values are R.

In the disclosure, a clock source in the chip generates a clock signal CLK. The clock signal CLK is a square wave with a fixed clock cycle with a certain error range. The clock cycle refers to a time interval from one clock edge to the next clock edge of the same type (e.g., both rising edges). The electronic components in the chip synchronously run according to the clock signal CLK. For example, data transmission, storage, and other operations are performed at rising edges and/or falling edges of the clock signal CLK. For ease of description, the disclosure assumes that the electronic components run at the rising edges of the clock signal CLK.

Figure 7:
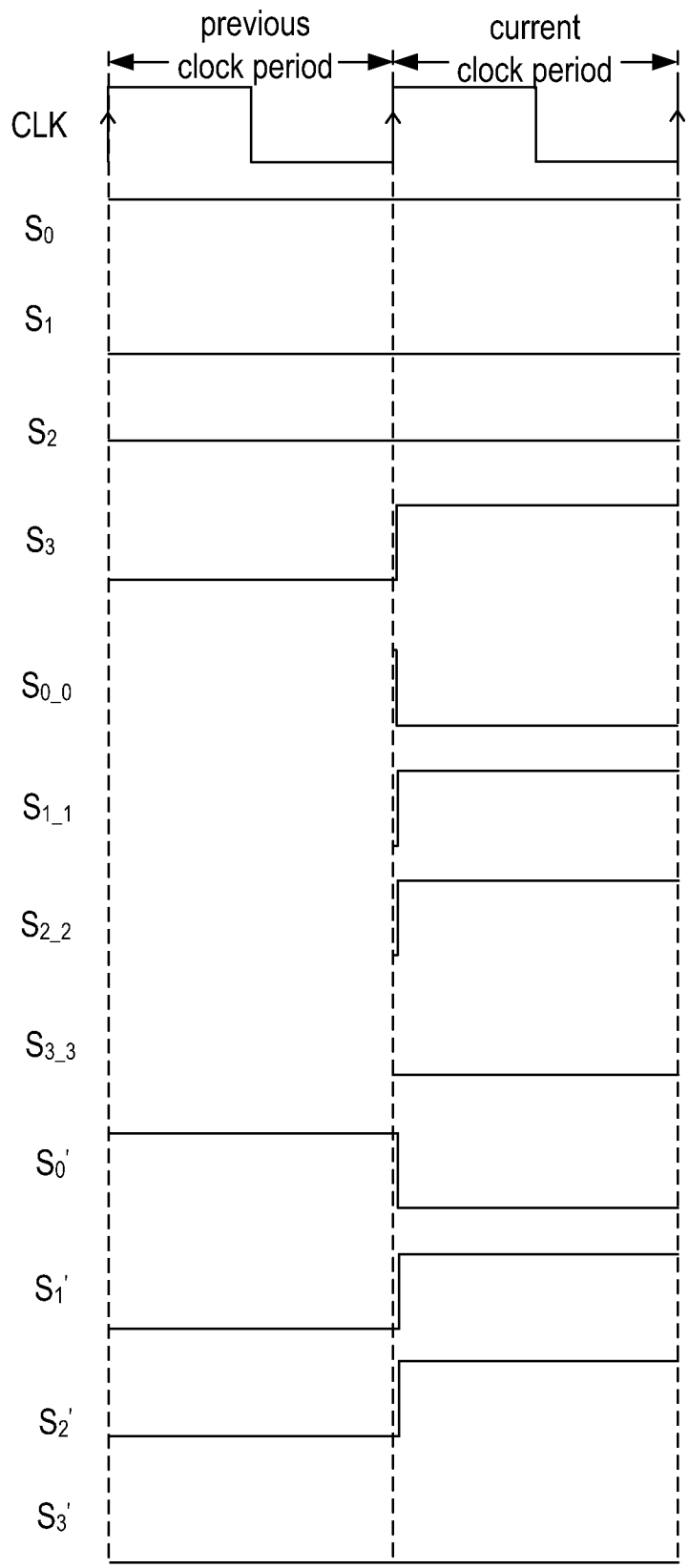
FIG. 7 shows a timing diagram of four first signals, a clock signal, four second signals, and four adjusted first signals according to an embodiment of the disclosure.

In the disclosure, one bit (e.g., a level state) of data is transmitted in one preset period. A preset period can be one clock cycle of the clock signal CLK, or half of the clock cycle of the clock signal CLK. For ease of description, the disclosure takes the preset period being one clock cycle as an example. A previous preset period occupies one clock cycle (which has occurred) before a certain current rising edge of the clock signal CLK, and a corresponding current preset period occupies one clock cycle (which is about to occur) after this current rising edge of the clock signal CLK. The previous preset period and the current preset period are two adjacent clock cycles divided by this current rising edge of the clock signal CLK, as shown in FIG. 7.

In the disclosure, when the current rising edge of the clock signal CLK arrives, a register in the chip parallelly receives and stores logic values of the adjusted first signals $S_0', S_1', \ldots, S_{(n-1)}'$, and clears the logic values of the adjusted first signals $S_0', S_1', \ldots, S_{(n-1)}'$ stored at the previous rising edge of the clock signal CLK. For example, when the current rising edge of the clock signal CLK arrives, the register parallelly receives and stores the logic "0" of the adjusted first signal $S_0'$ and the logic "1" of the adjusted first signal $S_1'$ (the logic "0" and "1" are the logic values of the adjusted first signals $S_0', S_1'$ within the current preset period, respectively), and clears the logic "1" of the adjusted first signal $S_0'$ and the logic "1" of the adjusted first signal $S_1'$ stored at the previous rising edge of the clock signal CLK (the logic "1" and "1" are the logical values of the adjusted first signals $S_0', S_1'$ within the previous preset period, respectively).

In the disclosure, the slew-rate control circuit determines whether it is necessary to invert the multiple first signals within the current preset period to obtain the multiple adjusted first signals within the current preset period according to a level relationship between a level state of each adjusted first signal in the previous preset period and a level state of a corresponding first signal in the current preset period, and a level relationship between a level state of each adjusted first signal in the previous preset period and a level state of a corresponding second signal in the current preset period. The above adjustment ensures that the slew rate range of the multiple adjusted first signals within the current preset period is within the preset slew rate range, thereby reducing the power consumption of a corresponding signal output circuit.

FIG. 1 shows a block diagram of a slew-rate control system 100 according to an embodiment of the disclosure. The slew-rate control system 100 is located in a chip. As shown in FIG. 1, the slew-rate control system 100 includes a slew-rate control circuit 110 and a signal output circuit 120. The slew-rate control circuit 110 is wired to the signal output circuit 120.

The slew-rate control circuit 110 is configured to parallelly receive multiple first signals $S_0, S_1, \ldots, S_{(n-1)}$ within the current preset period, determine whether to invert the multiple first signals $S_0, S_1, \ldots, S_{(n-1)}$ within the current preset period to generate multiple adjusted first signals $S_0', S_1', \ldots, S_{(n-1)}'$ within the current preset period, according to a level relationship between a level state of each adjusted first signal $S_0', S_1', \ldots, S_{(n-1)}'$ in the previous preset period and a level state of a corresponding first signal $S_0, S_1, \ldots, S_{(n-1)}$ in the current preset period, and a level relationship between a level state of each adjusted first signal $S_0', S_1', \ldots, S_{(n-1)}'$ in the previous preset period and a level state of a corresponding second signal $S_{0\_0}, S_{1\_1}, \ldots, S_{(n-1)\_(n-1)}$ in the current preset period, where n is a positive integer (i.e., n≥1).

In an embodiment, other modules in the chip generate first signals $S_0, S_1, \ldots, S_{(n-1)}$ which need to be parallelly output, where n is a positive integer (i.e., n≥1). Each of the first signals $S_0, S_1, \ldots, S_{(n-1)}$ transmits one bit forward at the rising edge of the clock signal CLK. The slew-rate control circuit 110 also parallelly receives the one bit transmitted forward by each of the first signals $S_0, S_1, \ldots, S_{(n-1)}$ at the rising edge of the clock signal CLK, thereby obtaining a level state of each of the first signals $S_0, S_1, \ldots, S_{(n-1)}$ within the current preset period. At the same time, the slew-rate control circuit 110 also reads a level state of each of the adjusted first signals $S_0', S_1', \ldots, S_{(n-1)}'$ in the previous preset period from a register. According to a level relationship between a level state of each adjusted first signal $S_0', S_1', \ldots, S_{(n-1)}'$ in the previous preset period and a level state of a corresponding first signal $S_0, S_1, \ldots, S_{(n-1)}$ in the current preset period, and a level relationship between a level state of each adjusted first signal $S_0', S_1', \ldots, S_{(n-1)}'$ in the previous preset period and a level state of a corresponding second signal $S_{0\_0}, S_{1\_1}, \ldots, S_{(n-1)\_(n-1)}$ in the current preset period, the circuit 110 determines whether to invert the first signals $S_0, S_1, \ldots, S_{(n-1)}$ within the current preset period to generate the adjusted first signals $S_0', S_1', \ldots, S_{(n-1)}'$ within the current preset period. The adjusted first signals $S_0', S_1', \ldots, S_{(n-1)}'$ within the current preset period are stored in the register and the adjusted first signals $S_0', S_1', \ldots, S_{(n-1)}'$ within the previous preset period are cleared from the register.

The signal output circuit 120 is coupled to the slew-rate control circuit 110, and is configured to parallelly output the multiple adjusted first signals $S_0', S_1', \ldots, S_{(n-1)}'$ within the current preset period. In an embodiment, the signal output circuit 120 is wired to receivers. The adjusted first signals $S_0', S_1', \ldots, S_{(n-1)}'$ within the current preset period are also output to the receivers at the rising edge of the clock signal CLK. It can be understood that the signal output circuit 120 can parallelly output multiple adjusted first signals $S_0', S_1', \ldots, S_{(n-1)}'$ in each preset period.

In addition, the signal output circuit 120 also generates an indicating signal $S_m$. When the indicating signal $S_m$ is in a first logic state, it indicates that the multiple adjusted first signals $S_0', S_1', \ldots, S_{(n-1)}'$ within the current preset period are obtained by inverting the multiple first signals $S_0, S_1, \ldots, S_{(n-1)}$ within the current preset period; when the indicating signal $S_m$ is in a second logic state, it indicates that the multiple adjusted first signals $S_0', S_1', \ldots, S_{(n-1)}'$ within the current preset period are the multiple first signals $S_0, S_1, \ldots, S_{(n-1)}$ within the current preset period. In an embodiment, the first logic state is a logic high level, and the second logic is a logic low level. In another embodiment, the first logic state is a logic low level, and the second logic state is a logic high level.

It can be seen that the slew-rate control system 100 determines a level relationship between a level state of each adjusted first signal in the previous preset period and a level state of the corresponding first signal in the current preset period, and a level relationship between a level state of each adjusted first signal in the previous preset period and a level state of the corresponding second signal in the current preset period through the slew-rate control circuit 110, and determines whether it is necessary to invert the multiple first signals in the current preset period to obtain the multiple adjusted first signals in the current preset period. The above adjustment ensures that the slew rate range of the multiple adjusted first signals within the current preset period is within the preset slew rate range, thereby reducing the power consumption of the signal output circuit 120.

Figure 2:
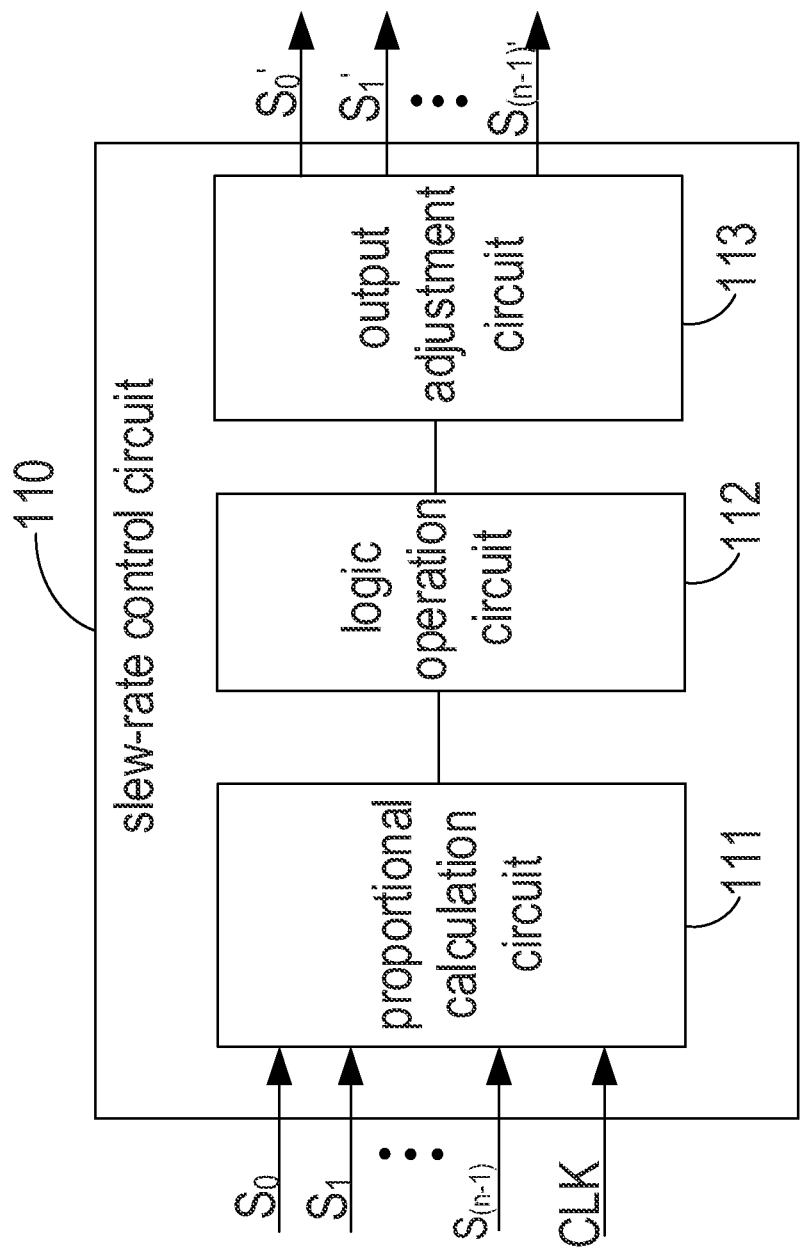
FIG. 2 shows a block diagram of a slew-rate control circuit according to an embodiment of the disclosure.

FIG. 2 shows a block diagram of the slew-rate control circuit 110 according to an embodiment of the disclosure. As shown in FIG. 2, the slew-rate control circuit 110 includes a proportional calculation circuit 111, a logic operation circuit 112, and an output adjustment circuit 113.

The proportional calculation circuit 111 is configured to parallelly receive the multiple first signals $S_0, S_1, \ldots, S_{(n-1)}$ within the current preset period, and generate a first indicating voltage $V_{O1}$ according to the multiple adjusted first signals $S_0', S_1', \ldots, S_{(n-1)}'$ within the previous preset period and the multiple first signals $S_0, S_1, \ldots, S_{(n-1)}$ within the current preset period, and generate a second indicating voltage $V_{O2}$ according to the multiple adjusted first signals $S_0', S_1', \ldots, S_{(n-1)}'$ within the previous preset period and the multiple second signals $S_{0\_0}, S_{1\_1}, \ldots, S_{(n-1)\_(n-1)}$ that are inverted from the multiple first signals $S_0, S_1, \ldots, S_{(n-1)}$ within the current preset period. The first indicating voltage $V_{O1}$ indicates a first numerical relationship between the number of low-level adjusted first signals within the previous preset period that respectively transition into high-level first signals within the current preset period, and the number of high-level adjusted first signals within the previous preset period that respectively transition into low-level first signals within the current preset period. The second indicating voltage $V_{O2}$ indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period. In an embodiment, the adjusted first signals $S_0', S_1', \ldots, S_{(n-1)}'$ within the previous preset period are stored in the register, and the first signals $S_0, S_1, \ldots, S_{(n-1)}$ within the current preset period are about to be received; if an adjusted first signal $S_i'$ in the previous preset period is at a low level and the corresponding first signal $S_i$ in the current preset period is at a high level, it is considered that the level change from the previous preset period to the current preset period is from low to high. If the adjusted first signal $S_i'$ in the previous preset period is at a low level and the first signal $S_i$ in the current preset period is also at a low level, it is considered that the level remains low from the previous preset period to the current preset period.

Figure 3:
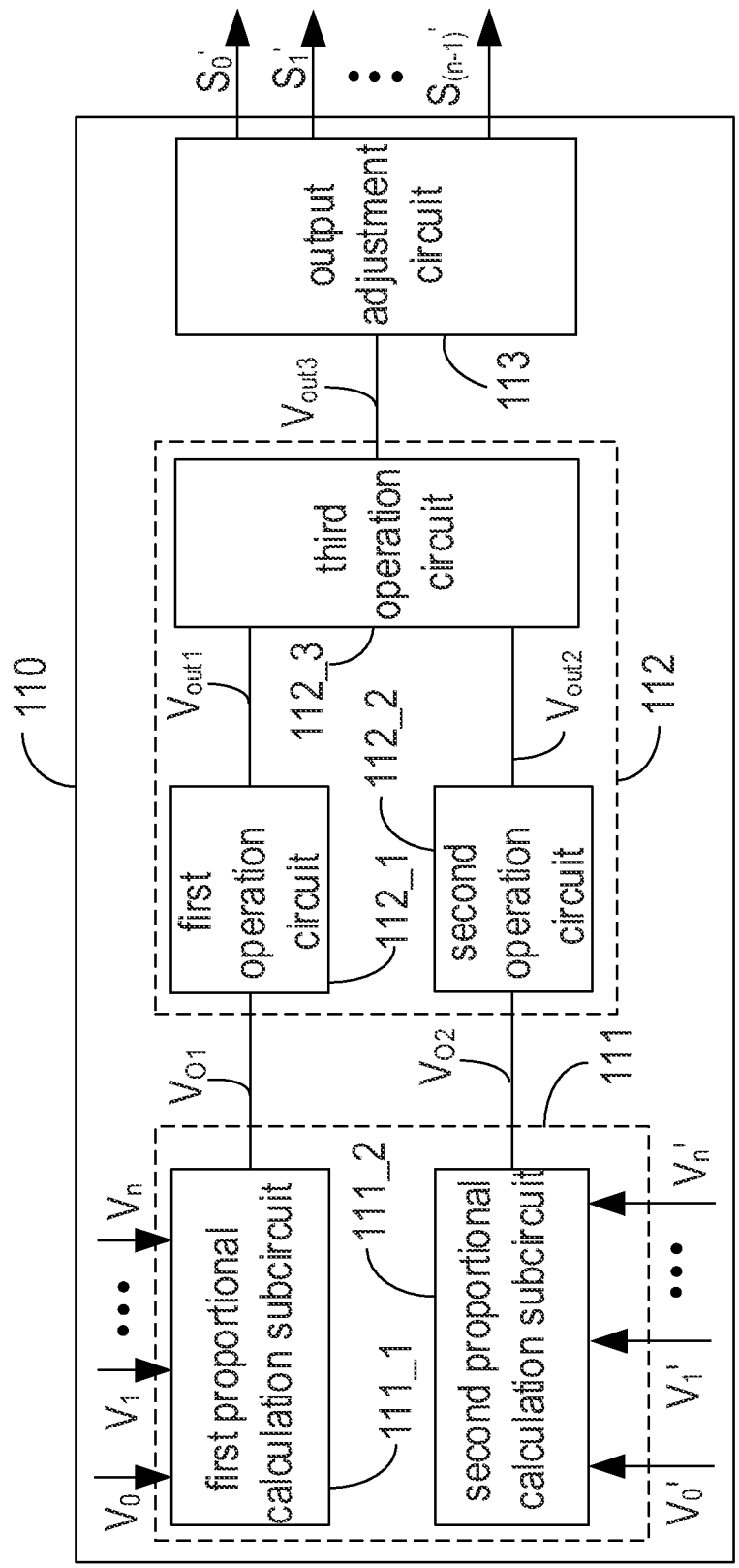
FIG. 3 shows a block diagram of a slew-rate control circuit according to an embodiment of the disclosure.

In an embodiment, as shown in FIG. 3, the proportional calculation circuit 111 includes a first proportional calculation subcircuit 111_1 and a second proportional calculation subcircuit 111_2. The first proportional calculation subcircuit 111_1 is configured to parallelly receive the multiple first signals $S_0, S_1, \ldots, S_{(n-1)}$ within the current preset period, and generate the first indicating voltage $V_{O1}$ according to the first numerical relationship between the number of low-level adjusted first signals $S_i'$ within the previous preset period that respectively transition into high-level first signals $S_i$ within the current preset period, and the number of high-level adjusted first signals $S_i'$ within the previous preset period that respectively transition into low-level first signals $S_i$ within the current preset period. The second proportional calculation subcircuit 111_2 is configured to parallelly receive the multiple first signals $S_0, S_1, \ldots, S_{(n-1)}$ within the current preset period, invert the multiple first signals $S_0, S_1, \ldots, S_{(n-1)}$ within the current preset period to obtain the multiple second signals $S_{0\_0}, S_{1\_1}, \ldots, S_{(n-1)\_(n-1)}$, and generate the second indicating voltage $V_{O2}$ according to the second numerical relationship between the number of low-level adjusted first signals $S_i'$ within the previous preset period that respectively transition into high-level second signals $S_{i\_i}$ within the current preset period, and the number of high-level adjusted first signals $S_i'$ within the previous preset period that respectively transition into low-level second signals $S_{i\_i}$ within the current preset period.

In an embodiment, the multiple second signals $S_{0\_0}, S_{1\_1}, \ldots, S_{(n-1)\_(n-1)}$ are obtained by inverting the multiple first signals $S_0, S_1, \ldots, S_{(n-1)}$ within the current preset period. For example, when the rising edge of the clock signal CLK arrives, the multiple first signals $S_0, S_1, \ldots, S_{(n-1)}$ in the current preset period are inverted through corresponding inverters to obtain the multiple second signals $S_{0\_0}, S_{1\_1}, \ldots, S_{(n-1)\_(n-1)}$.

The first proportional calculation subcircuit 111_1 includes multiple branches, where the multiple branches are coupled in parallel, and a voltage value $V_i$ of each first signal $S_i$ within the current preset period is input into a respective one of the multiple branches. For each of the multiple branches, after a transition from a corresponding adjusted first signal $S_i'$ of a first level state within the previous preset period to a corresponding first signal $S_i$ of a second level state within the current preset period, this branch conducts when the first level state is different from the second level state, at which time the first indicating voltage $V_{O1}$ is generated at a common end of the multiple branches.

Figure 4:
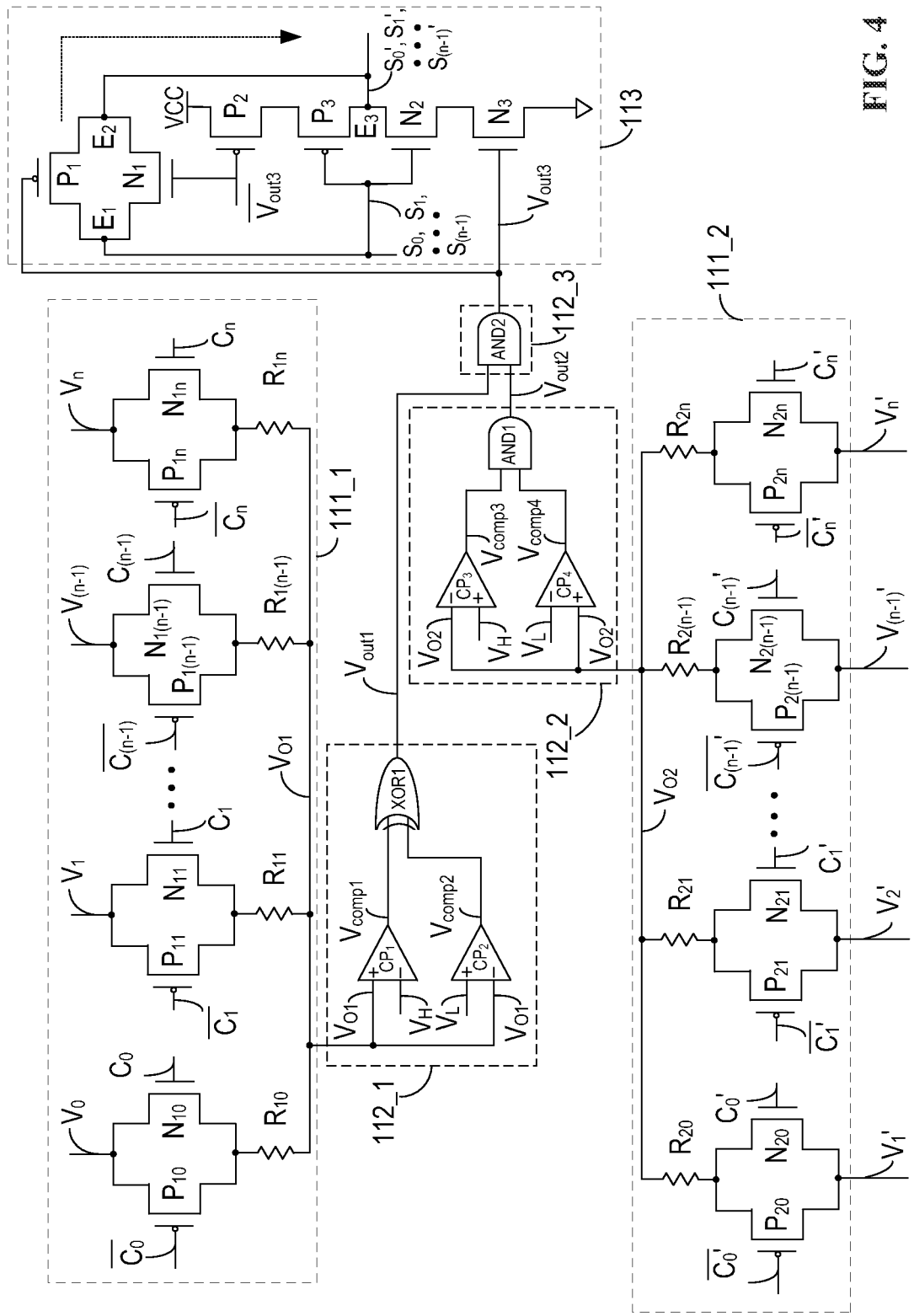
FIG. 4 shows a circuit diagram of a slew-rate control circuit according to an embodiment of the disclosure.

In an embodiment, as shown in FIGS. 4-6, each branch in the multiple branches includes a PMOS transistor $P_{1i}$, an NMOS transistor $N_{1i}$, and a resistor $R_{1i}$. The PMOS transistor $P_{1i}$ and the NMOS transistor $N_{1i}$ are coupled in parallel. A first end of the parallel-coupled PMOS transistor $P_{1i}$ and NMOS transistor $N_{1i}$ receives a voltage value $V_i$ of a corresponding first signal $S_i$ within the current preset period, and a second end of the parallel-coupled PMOS transistor $P_{1i}$ and NMOS transistor $N_{1i}$ is coupled to the resistor $R_{1i}$. The NMOS transistor $N_{1i}$ and the PMOS transistor $P_{1i}$ are turned on when the first level state is different from the second level state.

Figure 5A:
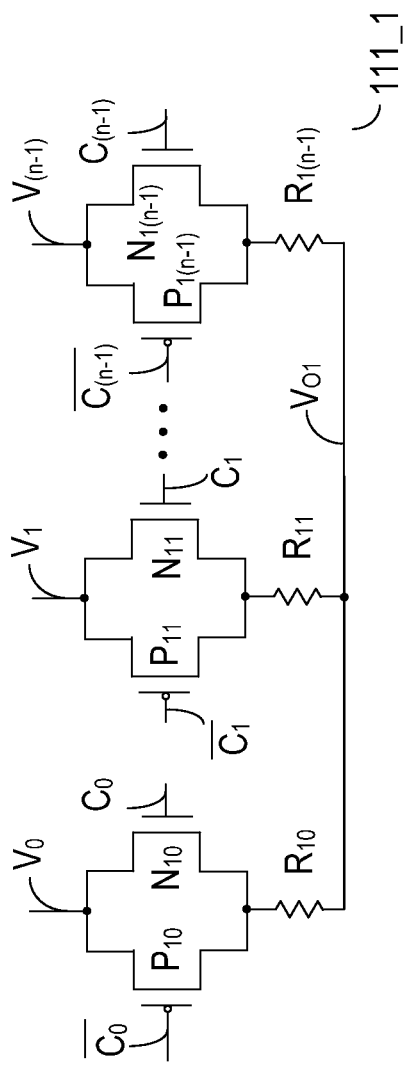
FIG. 5A shows a circuit diagram of a first proportional calculation subcircuit and FIG. 5B shows a circuit diagram of a second proportional calculation subcircuit according to an embodiment of the disclosure.

The first proportional calculation subcircuit 111_1 shown in FIG. 5A includes a zeroth branch, a first branch, . . . , and an (n−1)-th branch. In the zeroth branch, a first end of a parallel-coupled PMOS transistor $P_{10}$ and NMOS transistor $N_{10}$ receives a voltage value $V_0$ of the first signal $S_0$ in the current preset period, and a second end of the parallel-coupled PMOS transistor $P_{10}$ and NMOS transistor $N_{10}$ is coupled to a first end of a resistor $R_{10}$; a control end of the PMOS transistor $P_{10}$ receives a control signal $\overline{C_0}$, and a control end of the NMOS transistor $N_{10}$ receives a control signal $\overline{C_0}$ (where $C_0$ is obtained by inverting $C_0$, similar descriptions apply to the following and will not be repeated). In the first branch, a first end of a parallel-coupled PMOS transistor $P_{11}$ and NMOS transistor $N_{11}$ receives a voltage value $V_i$ of the first signal $S_1$ in the current preset period, and a second end of the parallel-coupled PMOS transistor $P_{11}$ and NMOS transistor $N_{11}$ is coupled to a first end of a resistor $R_{11}$; a control end of the PMOS transistor $P_{11}$ receives a control signal $\overline{C_1}$, and a control end of the NMOS transistor $N_{11}$ receives a control signal $C_1$; . . . . In the (n−1)-th branch, a first end of a parallel-coupled PMOS transistor $P_{1(n-1)}$ and NMOS transistor $N_{1(n-1)}$ receives a voltage value $V_{(n-1)}$ of the first signal $S_{(n-1)}$ in the current preset period, and a second end of the parallel-coupled PMOS transistor $P_{1(n-1)}$ and NMOS transistor $N_{1(n-1)}$ is coupled to a first end of a resistor $R_{1(n-1)}$; a control end of the PMOS transistor $P_{1(n-1)}$ receives a control signal $C_{(n-1)}$, and a control end of the NMOS transistor $N_{1(n-1)}$ receives a control signal $C_{(n-1)}$. Second ends of the resistors $R_{10}, R_{11}, \ldots, R_{1(n-1)}$ are coupled together to form a common end, and the first indicating voltage $V_{O1}$ is generated at the common end.

Regarding the control signal $C_i$, it is defined that if a level state of the adjusted first signal $S_i'$ in the previous preset period is different from a level state of the first signal $S_i$ in the current preset period, a control signal $C_i$ controls an NMOS transistor $N_{1i}$ to be turned on and a control signal $\overline{C_i}$ controls a PMOS transistor $P_{1i}$ to be turned on (that is, the i-th branch conducts), thereby generating the first indicating voltage $V_{O1}$ at the common end and a current $$\left(\text{i.e.,} \quad \frac{V_i - V_{O1}}{R}\right)$$

flowing through the i-th branch. In an embodiment, it is defined $C_i = L_{i2} \oplus L_{i1} = L_{i2} + \overline{L_{i1}} + \overline{L_{i2}} L_{i1}$, where $L_{i1}$ represents a logic value transmitted by the adjusted first signal $S_i'$ before the current rising edge of the clock signal CLK (i.e., a level state (a logic value) of the adjusted first signal $S_i'$ in the previous preset period), $L_{i2}$ represents a logic value to be transmitted by the first signal $S_i$ after the current rising edge of the clock signal CLK (i.e., a level state (a logic value) of the first signal $S_i$ in the current preset period). If the adjusted first signal $S_i'$ is at a logic high level in the clock cycle before the current rising edge of the clock signal CLK (i.e., $L_{i1}=1$) and the first signal $S_i$ is at a logic low level in the clock cycle after the current rising edge of the clock signal CLK (i.e., $L_{i2}=0$), or the adjusted first signal $S_i'$ is at a logic low level in the clock cycle before the current rising edge of the clock signal CLK (i.e., $L_{i1}=0$) and the first signal $S_i$ is at a logic high level in the clock cycle after the current rising edge of the clock signal CLK (i.e., $L_{i2}=1$), the control signal $C_i$ is at a logic high level (i.e., $C_i=1$, $\overline{C_i}=0$), the i-th branch conducts; if the adjusted first signal $S_i'$ is at a logic high level in the clock cycle before the current rising edge of the clock signal CLK and the first signal $S_i$ is also at a logic high level in the clock cycle after the current rising edge of the clock signal CLK (i.e., $L_{i1}=L_{i2}=1$), or the adjusted first signal $S_i'$ is at a logic low level in the clock cycle before the current rising edge of the clock signal CLK and the first signal $S_i$ is also at a logic low level in the clock cycle after the current rising edge of the clock signal CLK (i.e., $L_{i1}=L_{i2}=0$), the control signal $C_i$ is at a logic low level (i.e., $C_i=0$, $\overline{C_i}=1$), the i-th branch is disconnected.

When all branches (from the zeroth branch to the (n−1)-th branch) are disconnected at the current rising edge of the clock signal CLK, the first indicating voltage $V_{O1}$ generated at the common end is a floating voltage or an unstable voltage. In order to avoid this situation, the first proportional calculation subcircuit 111_1 shown in FIG. 4 also includes an n-th branch, which is not included in the first proportional calculation subcircuit 111_1 shown in FIG. 5A. In the n-th branch, a first end of a parallel-coupled PMOS transistor $P_{1n}$ and NMOS transistor $N_{1n}$ receives a voltage value $V_n$ of the clock signal CLK at the rising edge of the clock signal CLK, and a second end of the parallel-coupled PMOS transistor $P_{1n}$ and NMOS transistor $N_{1n}$ is coupled to a first end of a resistor $R_{1n}$, a control end of the PMOS transistor $P_{1n}$ receives a control signal $\overline{C_n}$, a control end of the NMOS transistor $N_{1n}$ receives a control signal $C_n$, and a second end of the resistor $R_{1n}$ is also coupled to the common end. Because the clock signal CLK undergoes level transition at the current rising edge of the clock signal CLK, $C_n=1$ and $\overline{C_n}=0$, the n-th branch always conducts. In this case, even if all branches (from the zeroth branch to the (n−1)-th branch) are disconnected, the first indicating voltage $V_{O1}$ is a fixed voltage (because the n-th branch conducts). In the embodiment, $V_{O1}=V_{high}$, where $V_{high}$ is a voltage value of the clock signal CLK when the clock signal CLK is at a high level. If a judgment is made at the falling edge of the clock signal CLK, $V_{O1}=V_{low}$, where $V_{low}$ is a voltage value of the clock signal CLK when the clock signal CLK is at a low level.

In another embodiment, on the basis of the first proportional calculation subcircuit 111_1 shown in FIG. 5A, the first proportional calculation subcircuit 111_1 shown in FIG. 6A may also include an n-th branch and an (n+1)-th branch. In the n-th branch, a first end of a parallel-coupled PMOS transistor $P_{1n}$ and NMOS transistor $N_{1n}$ receives a voltage value $V_n$ of the clock signal CLK at the rising edge of the clock signal CLK, and a second end of the parallel-coupled PMOS transistor $P_{1n}$ and NMOS transistor $N_{1n}$ is coupled to a first end of a resistor $R_{1n}$, a control end of the PMOS transistor Pin receives a control signal $\overline{C_n}$, and a control end of the NMOS transistor $N_{1n}$ receives a control signal $C_n$. In the (n+1)-th branch, a first end of a parallel-coupled PMOS transistor $P_{1(n+1)}$ and NMOS transistor $N_{1(n+1)}$ receives a voltage value $V_{(n+1)}$ of an inverted clock signal $\overline{CLK}$ at the falling edge of the inverted clock signal $\overline{CLK}$, and a second end of the parallel-coupled PMOS transistor $P_{1(n+1)}$ and NMOS transistor $N_{1(n+1)}$ is coupled to a first end of a resistor $R_{1(n+1)}$, a control end of the PMOS transistor $P_{1(n+1)}$ receives a control signal $\overline{C_{(n+1)}}$, and a control end of the NMOS transistor $N_{1(n+1)}$ receives a control signal $C_{(n+1)}$. A second end of the resistor $R_{1n}$ and a second end of the resistor $R_{1(n+1)}$ are coupled to the common end. Because the clock signal CLK undergoes level transition at the current rising edge of the clock signal CLK, $C_n=1$ and $\overline{C_n}=0$, the n-th branch always conducts, and a current flowing through the n-th branch is $$\frac{V_n - V_{O1}}{R};$$

the inverted clock signal $\overline{CLK}$ also undergoes level transition at the current falling edge of the inverted clock signal $\overline{CLK}$, $C_{(n+1)}=1$ and $\overline{C_{(n+1)}}=0$, the (n+1)-th branch always conducts, and a current flowing through the (n+1)-th branch is $$\frac{V_{(n+1)} - V_{O1}}{R}.$$

Even if all branches (from the zeroth branch to the (n−1)-th branch) are disconnected, the first indicating voltage $V_{O1}$ is a fixed voltage (because the n-th branch and the (n+1)-th branch conduct). At this time, $V_{O1}=(V_{high}+V_{low})/2$, where $V_{high}$ is a voltage value of the clock signal CLK when the clock signal CLK is at a high level, and $V_{low}$ is a voltage value of the clock signal CLK when the inverted clock signal $\overline{CLK}$ is at a low level. At this time, the voltage value of the first indicating voltage $V_{O1}$ is between a first reference voltage $V_H$ and a second reference voltage $V_L$ (which will be described below), in which case the slew rate of the first signals $S_0, S_1, \ldots, S_{(n-1)}$ to be output in the current preset period is considered to be within the preset slew rate range.

For the first proportional calculation subcircuit 111_1 shown in FIG. 4, it is assumed that the first, the second, the third, and the n-th branches conduct and the other branches are disconnected. In this case, because the sum of the currents flowing through the first, the second, the third, and the n-th branches is zero $$\left(\text{i.e.,} \frac{V_1 - V_{O1}}{R} + \frac{V_2 - V_{O1}}{R} + \frac{V_3 - V_{O1}}{R} + \frac{V_n - V_{O1}}{R} = 0\right),$$

the first indicating voltage $V_{O1}$ is $$\frac{V_1 + V_2 + V_3 + V_n}{4}.$$

In other words, the first indicating voltage $V_{O1}$ is an average value of input voltages of the above four branches (the first, the second, the third, and the n-th branches). The greater the voltage value of the first indicating voltage $V_{O1}$ is, the greater the number of low-level adjusted first signals $S_i'$ within the previous preset period that respectively transition into high-level first signals $S_i$ within the current preset is, and vice versa.

The second proportional calculation subcircuit 111_2 includes multiple branches. The multiple branches are coupled in parallel, and a voltage value $V_i'$ of each second signal $S_{i\_i}$ within the current preset period is input into a respective one of the multiple branches. For each of the multiple branches, after a transition from a corresponding adjusted first signal $S_i'$ of a first level state within the previous preset period to a corresponding second signal $S_{i\_i}$ of a third level state within the current preset period, this branch conducts when the first level state is different from the third level state, at which time the second indicating voltage $V_{O2}$ is generated at a common end of the multiple branches.

In an embodiment, as shown in FIG. 4, each branch in the multiple branches includes a PMOS transistor $P_{2i}$, an NMOS transistor $N_{2i}$, and a resistor $R_{2i}$. The PMOS transistor $P_{2i}$ and the NMOS transistor $N_{2i}$ are coupled in parallel, a first end of the parallel-coupled PMOS transistor $P_{2i}$ and NMOS transistor $N_{2i}$ receives a voltage value $V_i'$ of the corresponding second signal $S_{i\_i}$ in the current preset period, and a second end of the parallel-coupled PMOS transistor $P_{2i}$ and NMOS transistor $N_{2i}$ is coupled to the resistor $R_{2i}$. The NMOS transistor $N_{2i}$ and the PMOS transistor $P_{2i}$ are turned on when the first level state is different from the third level state.

Figure 5B:
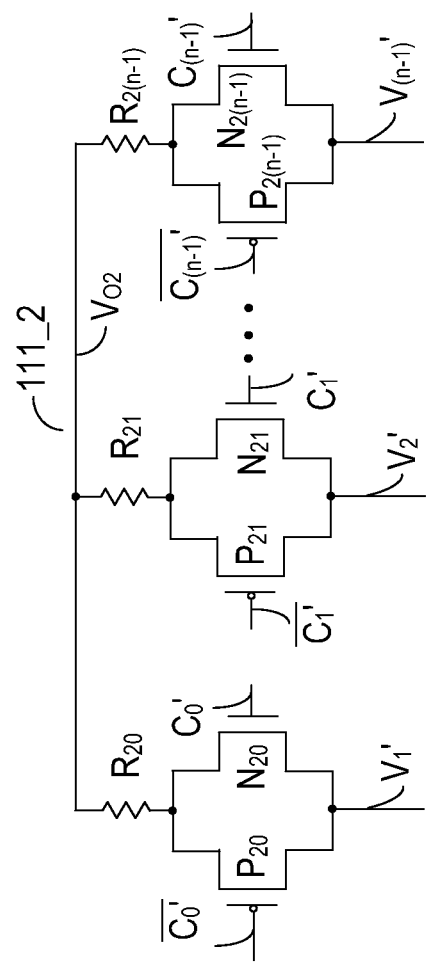

The second proportional calculation subcircuit 111_2 shown in FIG. 5B includes a zeroth branch, a first branch, . . . , and an (n−1)th branch. In the zeroth branch, a first end of a parallel-coupled PMOS transistor $P_{20}$ and NMOS transistor $N_{20}$ receives a voltage value $V_0'$ of the second signal $S_{0\_0}$ in the current preset period, and a second end of the parallel-coupled PMOS transistor $P_{20}$ and NMOS transistor $N_{20}$ is coupled to a first end of a resistor $R_{20}$. A control end of the PMOS transistor $P_{20}$ receives a control signal $\overline{C_0'}$, and a control end of the NMOS transistor $N_{20}$ receives a control signal $\overline{C_0'}$ ($C_0'$ is obtained by inverting $C_0'$, similar descriptions apply to the following and will not be repeated). In the first branch, a first end of a parallel-coupled PMOS transistor $P_{21}$ and NMOS transistor $N_{21}$ receives a voltage value $V_i'$ of the second signal $S_{1\_1}$ in the current preset period, and a second end of the parallel-coupled PMOS transistor $P_{21}$ and NMOS transistor $N_{21}$ is coupled to a first end of a resistor $R_{21}$. A control end of the PMOS transistor $P_{21}$ receives a control signal $\overline{C_1'}$, and a control end of the NMOS transistor $N_{21}$ receives a control signal $C_1'$, . . . . In the (n−1)-th branch, a first end of a parallel-coupled PMOS transistor $P_{2(n-1)}$ and NMOS transistor $N_{2(n-1)}$ receives a voltage value $V_{(n-1)}'$ of the second signal $S_{(n-1)\_(n-1)}$ in the current preset period, and a second end of the parallel-coupled PMOS transistor $P_{2(n-1)}$ and NMOS transistor $N_{2(n-1)}$ is coupled to a first end of a resistor $R_{2(n-1)}$. A control end of the PMOS transistor $P_{2(n-1)}$ receives a control signal $\overline{C_{(n-1)}'}$, and a control end of the NMOS transistor $N_{2(n-1)}$ receives a control signal $C_{(n-1)}'$; second ends of the resistors $R_{21}$, $R_{22}$, . . . , $R_{2(n-1)}$ are coupled together to form a common end, and the second indicating voltage $V_{O2}$ is generated at the common end.

Regarding the control signal $C_i'$, it is defined that if a level state of the adjusted first signal $S_i'$ in the previous preset period is different from a level state of the second signal $S_{i\_i}$ in the current preset period, a control signal $C_i'$ controls an NMOS transistor $N_{2i}$ to be turned on and a control signal $\overline{C_i'}$ controls a PMOS transistor $P_{2i}$ to be turned on (that is, the i-th branch conducts), thereby generating the second indicating voltage $V_{O2}$ at the common end and a current $$\left(\text{i.e.,}\ \frac{V_i' - V_{O2}}{R}\right)$$

flowing through the i-th branch. In an embodiment, it is defined $C_i'=L_{i4}\oplus L_{i3}=L_{i4}\overline{L_{i3}}+\overline{L_{i4}}L_{i3}$, where $L_{i3}$ represents a logic value transmitted by the adjusted first signal $S_i'$ before the current rising edge of the clock signal CLK (i.e., a level state (a logic value) of the adjusted first signal $S_i'$ in the previous preset period), $L_{i4}$ represents a logic value to be transmitted by the second signal $S_{i\_i}$ after the current rising edge of the clock signal CLK (i.e., a level state (a logic value) of the second signal $S_{i\_i}$ in the current preset period).

If the adjusted first signal $S_i'$ is at a logic high level in the clock cycle before the current rising edge of the clock signal CLK (i.e., $L_{i3}$=1) and the second signal $S_{i\_i}$ is at a logic low level in the clock cycle after the current rising edge of the clock signal CLK (i.e., $L_{i4}$=0), or the adjusted first signal $S_i'$ is at a logic low level in the clock cycle before the current rising edge of the clock signal CLK (i.e., $L_{i3}$=0) and the second signal $S_{i\_i}$ is at a logic high level in the clock cycle after the current rising edge of the clock signal CLK (i.e., $L_{i4}$=1), the control signal $C_i'$ is at a logic high level (i.e., $C_i'$=1 and $\overline{C_i'}$=0), the i-th branch conducts; if the adjusted first signal $S_1'$ is at a logic high level in the clock cycle before the current rising edge of the clock signal CLK and the second signal $S_{i\_i}$ is also at a logic high level in the clock cycle after the current rising edge of the clock signal CLK (i.e., $L_{i3}$=$L_{i4}$=1), or the adjusted first signal $S_i'$ is at a logic low level in the clock cycle before the current rising edge of the clock signal CLK and the second signal $S_{i\_i}$ is also at a logic low level in the clock cycle after the current rising edge of the clock signal CLK (i.e., $L_{i3}$=$L_{i4}$=0), the control signal $C_i'$ is at a logic low level (i.e., $C_i'$=0 and $\overline{C_i'}$=1), the i-th branch is disconnected.

When all branches (from the zeroth branch to the (n−1)-th branch) are disconnected at the current rising edge of the clock signal CLK shown in FIG. 5B, the second indicating voltage $V_{O2}$ generated at the common end is a floating voltage or an unstable voltage. In order to avoid this situation, the second proportional calculation subcircuit 111_2 shown in FIG. 4 also includes an n-th branch, which is not included in the first proportional calculation subcircuit 111_2 shown in FIG. 5B. In the n-th branch, a first end of a parallel-coupled PMOS transistor $P_{2n}$ and NMOS transistor $N_{2n}$ receives a voltage value $V_n'$ of the clock signal CLK at the rising edge of the clock signal CLK, a second end of the parallel-coupled PMOS transistor $P_{2n}$ and NMOS transistor $N_{2n}$ is coupled to a first end of a resistor $R_{2n}$, a control end of the PMOS transistor $P_{2n}$ receives a control signal $\overline{C_n'}$, a control end of the NMOS transistor $N_{2n}$ receives a control signal $C_n'$, and a second end of the resistor $R_{2n}$ is coupled to the common end. Because the clock signal CLK undergoes level transition at the current rising edge of the clock signal CLK, $C_n'$=1 and $\overline{C_n'}$=0, the n-th branch always conducts. Although the branches (from the zeroth branch to the (n−1)-th branch) are disconnected, the second indicating voltage $V_{O2}$ is a fixed voltage (because the n-th branch conducts). In the embodiment, $V_{O1}$=$V_{high}$, where $V_{high}$ is a voltage value of the clock signal CLK when the clock signal CLK is at a high level. If a judgment is made at the falling edge of the clock signal CLK, $V_{O1}$=$V_{low}$, where $V_{low}$ is a voltage value of the clock signal CLK when the clock signal CLK is at a low level.

In another embodiment, on the basis of the second proportional calculation subcircuit 111_2 shown in FIG. 5B, the second proportional calculation subcircuit 111_2 shown in FIG. 6B may also include an n-th branch and an (n+1)-th branch. In the n-th branch, a first end of a parallel-coupled PMOS transistor $P_{2n}$ and NMOS transistor $N_{2n}$ receives a voltage value $V_n'$ of the clock signal CLK at the rising edge of the clock signal CLK, and a second end of the parallel-coupled PMOS transistor $P_{2n}$ and NMOS transistor $N_{2n}$ is coupled to a first end of a resistor $R_{2n}$, a control end of the PMOS transistor $P_{2n}$ receives a control signal $\overline{C_n'}$, and a control end of the NMOS transistor $N_{2n}$ receives a control signal $C_n'$. In the (n+1)-th branch, a first end of a parallel-coupled PMOS transistor $P_{2(n+1)}$ and NMOS transistor $N_{2(n+1)}$ receives a voltage value $V_{(n+1)}'$ of an inverted clock signal $\overline{CLK}$ at the falling edge of the inverted clock signal $\overline{CLK}$, and a second end of the parallel-coupled PMOS transistor $P_{2(n+1)}$ and NMOS transistor $N_{2(n+1)}$ is coupled to a first end of a resistor $R_{2(n+1)}$. A control end of the PMOS transistor $P_{2(n+1)}$ receives a control signal $\overline{C_{(n+1)}'}$, and a control end of the NMOS transistor $N_{2(n+1)}$ receives a control signal $C_{(n+1)}'$. A second end of the resistor $R_{1n}$ and a second end of the resistor $R_{2(n+1)}$ are coupled to the common end. Because the clock signal CLK undergoes level transition at the current rising edge of the clock signal CLK, $C_n'=1$ and $\overline{C_n'}=0$, the n-th branch always conducts, and a current flowing through the n-th branch is $$\frac{V_n' - V_{O2}}{R};$$

the inverted clock signal $\overline{CLK}$ also undergoes level transition at the current falling edge of the inverted clock signal $\overline{CLK}$, $C_{(n+1)}'=1$ and $\overline{C_{(n+1)}'}=0$, the (n+1)-th branch always conducts, and a current flowing through the (n+1)-th branch is $$\frac{V_{(n+1)}' - V_{O2}}{R}.$$

Even if the branches (from the zeroth branch to the (n−1)-th branch) are disconnected, the second indicating voltage $V_{O2}$ is a fixed voltage (because the n-th branch and the (n+1)-th branch conduct), at this time, $V_{O2}=(V_{high}+V_{low})/2$, where $V_{high}$ is a voltage value of the clock signal CLK when the clock signal CLK is at a high level, and $V_{low}$ is a voltage value of the clock signal CLK when the inverted clock signal $\overline{CLK}$ is at a low level. At this time, the voltage value of the second indicating voltage $V_{O2}$ is between the first reference voltage $V_H$ and the second reference voltage $V_L$ (which will be described below).

Because the second signal $S_{i\_i}$ is obtained by inverting the first signal $S_i$ in the current preset period, the branches that conduct at the current rising edge of the clock signal CLK in the second proportional calculation subcircuit 111_2 are branches other than the first, the second, and the third branches. For the second proportional calculation subcircuit 111_2 shown in FIG. 4, because the sum of the currents flowing through the branches other than the first, the second, and the third branches is zero $$\left(\text{i.e., } \frac{V_0' - V_{O2}}{R} + \frac{V_4' - V_{O2}}{R} + \frac{V_5' - V_{O2}}{R} + \ldots + \frac{V_n' - V_{O2}}{R} = 0\right),$$

the second indicating voltage $V_{O2}$ is $$\frac{V_0' + V_4' + V_5' + \ldots + V_n'}{n-3}.$$

In other words, the second indicating voltage $V_{O2}$ is an average value of input voltages of the branches other than the first, the second, and the third branches. The greater the voltage value of the second indicating voltage $V_{O2}$ is, the number of low-level adjusted first signals $S_i'$ within the previous preset period that respectively transition into high-level second signals $S_{i\_i}$ within the current preset period is, and vice versa. Because the second signals $S_{0\_0}, S_{1\_1}, \ldots, S_{(n-1)\_(n-1)}$ are obtained by inverting the first signals $S_0$, $S_1, \ldots, S_{(n-1)}$ in the current preset period, the greater the second indicating voltage $V_{O2}$ is, the greater the number of low-level adjusted first signals $S_i'$ in the previous preset period that transition into low-level first signals $S_i$ in the current preset period is.

The logic operation circuit 112 is coupled to the proportional calculation circuit 111 and is configured to generate an operation result according to a numerical relationship between the first indicating voltage $V_{O1}$ and the first, second reference voltages $V_H$, $V_L$, and a numerical relationship between the second indicating voltage $V_{O2}$ and the first, second reference voltages $V_H$, $V_L$. The first reference voltage $V_H$ is greater than the second reference voltage $V_L$. In an embodiment, the first reference voltage $V_H$ is an upper limit of the preset slew rate range, and the second reference voltage $V_L$ is a lower limit of the preset slew rate range. The preset slew rate range is a slew rate range acceptable to the users or designers.

In an embodiment, the logic operation circuit 112 includes a first operation circuit 112_1, a second operation circuit 112_2, and a third operation circuit 112_3.

The first operation circuit 112_1 is coupled to the proportional calculation circuit 111 and is configured to generate a first initial operation result $V_{out1}$ according to the numerical relationship between the first indicating voltage $V_{O1}$ and the first, second reference voltages $V_H$, $V_L$. When the first indicating voltage $V_{O1}$ is greater than the first reference voltage $V_H$ or less than the second reference voltage $V_L$, the first initial operation result $V_{out1}$ is in a first logic state (e.g., a logic high level); when the first indicating voltage $V_{O1}$ is not greater than the first reference voltage $V_H$ and not less than the second reference voltage $V_L$, the first initial operation result $V_{out1}$ is in a second logic state (e.g., a logic low level), where the first logic state is different from the second logic state.

In an embodiment, the first operation circuit 112_1 includes a first comparator $CP_1$, a second comparator $CP_2$, and an XOR gate XOR1. An exemplary connection relationship thereof is as follows: a non-inverting input end of the first comparator $CP_1$ receives the first indicating voltage $V_{O1}$, an inverting input end of the first comparator $CP_1$ receives the first reference voltage $V_H$, and an output end of the first comparator $CP_1$ outputs a first comparison result $V_{comp1}$; a non-inverting input end of the second comparator $CP_2$ receives the second reference voltage $V_L$, an inverting input end of the second comparator $CP_2$ receives the first indicating voltage $V_{O1}$, and an output end of the second comparator $CP_2$ outputs a second comparison result $V_{comp2}$. The XOR gate XOR1 performs an XOR operation on the first comparison result $V_{comp1}$ and the second comparison result $V_{comp2}$ and generates the first initial operation result $V_{out1}$.

When $V_{O1} > V_H$, the first comparator $CP_1$ outputs a high level (i.e., $V_{comp1}=1$), the second comparator $CP_2$ outputs a low level (i.e., $V_{comp2}=0$), and the XOR gate XOR1 outputs a high level (i.e., $V_{out1}=1$). This situation indicates that the number of low-level adjusted first signals $S_i'$ in the previous preset period that transition into high-level first signal $S_i$ in the current preset period is greater than the number of high-level adjusted first signals $S_1'$ in the previous preset period that transition into low-level first signals $S_i$ in the current preset period.

When $V_{O1} < V_L$, the first comparator $CP_1$ outputs a low level (i.e., $V_{comp1}=0$), the second comparator $CP_2$ outputs a high level (i.e., $V_{comp2}=1$), and the XOR gate XOR1 outputs a high level (i.e., $V_{out1}=1$). This situation indicates that the number of low-level adjusted first signals $S_i'$ in the previous preset period that transition into high-level first signal $S_i$ in the current preset period is less than the number of high-level adjusted first signals $S_1'$ in the previous preset period that transition into low-level first signals $S_i$ in the current preset period.

When $V_L \leq V_{O1} \leq V_H$, the first comparator $CP_1$ outputs a low level (i.e., $V_{comp1}=0$), the second comparator $CP_2$ outputs a low level (i.e., $V_{comp2}=0$), and the XOR gate XOR1 outputs a low level (i.e., $V_{out1}=0$). This situation indicates that the number of low-level adjusted first signals $S_i'$ in the previous preset period that transition into high-level first signals $S_i$ in the current preset period is basically equal to the number of high-level adjusted first signals $S_i'$ in the previous preset period that transition into low-level first signals $S_i$ in the current preset period, and also indicates that at the current rising edge of the clock signal CLK, the actual slew rate range of the first signals $S_0, S_1, \ldots, S_{(n-1)}$ to be output is within the preset slew rate range.

The second operation circuit 112_2 is coupled to the proportional calculation circuit 111 and is configured to generate a second initial operation result $V_{out2}$ according to a numerical relationship between the second indicating voltage $V_{O2}$ and the first, second reference voltages $V_H$, $V_L$. When the second indicating voltage $V_{O2}$ is greater than the first reference voltage $V_H$ or less than the second reference voltage $V_L$, the second initial operation result $V_{out2}$ is in a third logic state (e.g., a logic low level). When the second indicating voltage $V_{O2}$ is not greater than the first reference voltage $V_H$ and not less than the second reference voltage $V_L$, the second initial operation result $V_{out2}$ is in a fourth logic state (e.g., a logic high level), where the third logic state is different from the fourth logic state.

In an embodiment, the second operation circuit 112_2 includes a third comparator $CP_3$, a fourth comparator $CP_4$, and a first AND gate AND1. An exemplary connection relationship thereof is as follows: a non-inverting input end of the third comparator $CP_3$ receives the first reference voltage $V_H$, an inverting input end of the third comparator $CP_3$ receives the second indicating voltage $V_{O2}$, and an output end of the third comparator $CP_3$ outputs the third comparison result $V_{comp3}$; a non-inverting input end of the fourth comparator $CP_4$ receives the second indicating voltage $V_{O2}$, an inverting input end of the fourth comparator $CP_4$ receives the second reference voltage $V_L$, and an output end of the fourth comparator $CP_4$ outputs the fourth comparison result $V_{comp4}$; the first AND gate AND1 performs an AND operation on the third comparison result $V_{comp3}$ and the fourth comparison result $V_{comp4}$ to generate the second initial operation result $V_{out2}$.

When $V_{O2}>V_H$, the third comparator $CP_3$ outputs a low level (i.e., $V_{comp3}=0$), the fourth comparator $CP_4$ outputs a high level (i.e., $V_{comp4}=0$), and the AND gate AND1 outputs a low level (i.e., $V_{out2}=0$). This situation indicates that the number of low-level adjusted first signals $S_i'$ in the previous preset period that transition into high-level second signals $S_{i\_j}$ in the current preset period is greater than the number of high-level adjusted first signals $S_i'$ in the previous preset period that transition into low-level second signals $S_{i\_j}$ in the current preset period, and it further indicates that the number of low-level adjusted first signals $S_0', S_1', \ldots, S_{(n-1)}'$ in the previous preset period that transition into low-level first signals $S_0, S_1, \ldots, S_{(n-1)}$ in the current preset period is greater than the number of high-level adjusted first signals $S_0', S_1', \ldots, S_{(n-1)}'$ in the previous preset period that transition into high-level first signals $S_0, S_1, \ldots, S_{(n-1)}$ in the current preset period.

When $V_L \leq V_{O2} \leq V_H$, the third comparator $CP_3$ outputs a high level (i.e., $V_{comp3}=1$), the fourth comparator $CP_4$ outputs a high level (i.e., $V_{comp4}=1$), and the first AND gate AND1 outputs a high level (i.e., $V_{out2}=1$). This situation indicates that the number of low-level adjusted first signals $S_i'$ in the previous preset period that transition into high-level second signals $S_{i\_j}$ in the current preset period is basically equal to the number of high-level adjusted first signals $S_i'$ in the previous preset period that transition into low-level second signals $S_{i\_j}$ in the current preset period, and it further indicates that the number of low-level adjusted first signals $S_0', S_1', \ldots, S_{(n-1)}'$ in the previous preset period that transition into low-level first signals $S_0, S_1, \ldots, S_{(n-1)}$ in the current preset period is basically equal to the number of high-level adjusted first signals $S_0', S_1', \ldots, S_{(n-1)}'$ in the previous preset period that transition into high-level first signals $S_0, S_1, \ldots, S_{(n-1)}$ in the current preset period.

When $V_{O2}<V_L$, the third comparator $CP_3$ outputs a high level (i.e., $V_{comp3}=1$), the fourth comparator $CP_4$ outputs a low level (i.e., $V_{comp4}=0$), and the first AND gate AND1 outputs a low level (i.e., $V_{out2}=0$). This situation indicates that the number of low-level adjusted first signals $S_0', S_1', \ldots, S_{(n-1)}'$ in the previous preset period that transition into high-level second signals $S_{i\_j}$ in the current preset period is less than the number of high-level adjusted first signals $S_i'$ in the previous preset period that transition into low-level second signals $S_{i\_j}$ in the current preset period, and it further indicates that the number of low-level adjusted first signal $S_0', S_1', \ldots, S_{(n-1)}'$ in the previous preset period that transition into low-level first signals $S_0, S_1, \ldots, S_{(n-1)}$ in the current preset period is less than the number of high-level adjusted first signal $S_0', S_1', \ldots, S_{(n-1)}'$ in the previous preset period that transition into high-level first signals $S_0, S_1, \ldots, S_{(n-1)}$ in the current preset period.

The third operation circuit 112_3 is coupled to the first operation circuit 112_1 and the second operation circuit 112_2, and is configured to perform a logic operation on the first initial operation result $V_{out1}$ and the second initial operation result $V_{out2}$, and generate the operation result $V_{out3}$ that indicates whether to invert the multiple first signals $S_0, S_1, \ldots, S_{(n-1)}$ in the current preset period.

In an embodiment, the third operation circuit 112_3 includes a second AND gate AND2. The second AND gate AND2 is coupled to the first operation circuit 112_1 and the second operation circuit 112_2, and is configured to perform an AND operation on the first initial operation result $V_{out1}$ and the second initial operation result $V_{out2}$ and generate the operation result $V_{out3}$. The operation result $V_{out3}$ in a fifth logic state indicates that the multiple first signals $S_0, S_1, \ldots, S_{(n-1)}$ in the current preset period are to be inverted; the operation result $V_{out3}$ in a sixth logic state indicates that the multiple first signals $S_0, S_1, \ldots, S_{(n-1)}$ in the current preset period are not to be inverted, where the fifth logic state is different from the sixth logic state. In an embodiment, the fifth logic state is a logic high level, and the sixth logic state is a logic low level.

When $V_{out1}=1$ and $V_{out2}=1$, $V_{out3}=1$. This situation indicates that an inversion operation can improve the slew rate range, so it is necessary to invert the first signals $S_0, S_1, \ldots, S_{(n-1)}$ in the current preset period, that is, $V_{out3}=1$ indicates that the first signals $S_0, S_1, \ldots, S_{(n-1)}$ in the current preset period are to be inverted.

When $V_{out1}=1$ and $V_{out2}=0$, $V_{out3}=0$. This situation indicates that an inversion operation cannot improve the slew rate range, so it is not necessary to invert the first signals $S_0, S_1, \ldots, S_{(n-1)}$ in the current preset period, that is, $V_{out3}=0$ indicates that the first signals $S_0, S_1, \ldots, S_{(n-1)}$ in the current preset period are not to be inverted.

When $V_{out1}=0$ and $V_{out2}=1$, $V_{out3}=0$. This situation indicates that an inversion operation cannot further improve the slew rate range because the slew rate range of the first signals $S_0, S_1, \ldots, S_{(n-1)}$ to be output is within the preset slew rate range, so it is not necessary to invert the first signals $S_0, S_1, \ldots, S_{(n-1)}$ in the current preset period, that is, $V_{out3}=0$ indicates that the first signals $S_0, S_1, \ldots, S_{(n-1)}$ in the current preset period are not to be inverted.

When $V_{out1}=0$ and $V_{out2}=0$, $V_{out3}=0$. This situation indicates that an inversion operation will further expand the slew rate range, so it is not necessary to invert the first signals $S_0, S_1, \ldots, S_{(n-1)}$ in the current preset period, that is, $V_{out3}=0$ indicates that the first signals $S_0, S_1, \ldots, S_{(n-1)}$ in the current preset period are not to be inverted.

The output adjustment circuit 113 is coupled to the logic operation circuit 112, and is configured to receive the operation result $V_{out3}$ and determine whether to invert the multiple first signals $S_0, S_1, \ldots, S_{(n-1)}$ within the current preset period to correspondingly generate the multiple adjusted first signals $S_0', S_1', \ldots, S_{(n-1)}'$ in the current preset period according to the operation result $V_{out3}$.

In an embodiment, as shown in FIG. 4, the output adjustment circuit 113 includes a first PMOS transistor $P_1$ and a first NMOS transistor $N_1$ coupled in parallel, and a second PMOS transistor $P_2$, a third PMOS transistor $P_3$, a second NMOS transistor $N_2$, and a third NMOS transistor $N_3$ coupled in series. The operation result $V_{out3}$ is input to a control end of the first PMOS transistor $P_1$ and a control end of the third NMOS transistor $N_3$, the multiple first signals $S_0, S_1, \ldots, S_{(n-1)}$ are input to a control end of the third PMOS transistor $P_3$, a control end of the second NMOS transistor $N_2$, and a common node $E_1$ of the parallel-coupled first PMOS transistor $P_1$ and first NMOS transistor $N_1$, and an inverted operation result $\overline{V_{out3}}$ is input to a control end of the first NMOS transistor $N_1$ and a control end of the second PMOS transistor $P_2$. The adjusted first signals $S_0', S_1', \ldots, S_{(n-1)}'$ are output from the node $E_2$ or node $E_3$ as shown in FIG. 4. In addition, the signal output circuit 120 receives the operation result $V_{out3}$ and generates the indicating signal $S_m$. An exemplary working principle of the output adjustment circuit 113 is as follows:

When $V_{out3}$ is at a logic low level, only the PMOS transistor $P_1$ and the NMOS transistor $N_1$ are turned on, and the first signals $S_0, S_1, \ldots, S_{(n-1)}$ in the current preset period are output in a direction indicated by the dashed arrow in the FIG. 4; that is, in the current preset period, the adjusted first signals $S_0', S_1', \ldots, S_{(n-1)}'$ are the first signals $S_0, S_1, \ldots, S_{(n-1)}$. When $V_{out3}$ is at a logic high level, only the NMOS transistor $N_3$ and the PMOS transistor $P_2$ are turned on, and the first signals $S_0, S_1, \ldots, S_{(n-1)}$ in the current preset period are inverted by an inverter composed of the PMOS transistor $P_3$ and the NMOS transistor $N_2$ to obtain inverted first signals $\overline{S_0}, \overline{S_1}, \ldots, \overline{S_{(n-1)}}$, that is, in the current preset period, the adjusted first signals $S_0', S_1', \ldots, S_{(n-1)}'$ are the inverted first signals $\overline{S_0}, \overline{S_1}, \ldots, \overline{S_{(n-1)}}$.

According to FIG. 4, the disclosure illustrates the working principle of the slew-rate control circuit 110 with a specific embodiment. FIG. 7 shows a timing diagram of the clock signal CLK, four first signals $S_0, S_1, S_2, S_3$, four second signals $S_{0\_0}, S_{1\_1}, S_{2\_2}, S_{3\_3}$, and four adjusted first signals $S_0', S_1', S_2', S_3'$ for two adjacent preset periods (e.g., the previous clock cycle and the current clock cycle). One bit of data (for example, logic "0" or "1") is transmitted in one clock cycle. In the embodiment, data transmission is performed at the rising edge of the clock signal CLK. Because there will be some delay in any signal transmission process, the data transmission of the four first signals $S_0, S_1, S_2, S_3$, four second signals $S_{0\_0}, S_{1\_1}, S_{2\_2}, S_{3\_3}$, and four adjusted first signals $S_0', S_1', S_2', S_3'$ will slightly lag behind the rising edge of the clock signal CLK. In the embodiment, in the previous clock cycle, the original input signals are the first signals $S_0, S_1, S_2, S_3$, and the final output signals are the adjusted first signals $S_0', S_1', S_2', S_3'$. It is assumed that the adjusted first signals $S_0', S_1', S_2', S_3'$ in the previous clock cycle are the first signals $S_0, S_1, S_2, S_3$ in the previous clock cycle, and are stored in the register. In the current clock cycle, the original input signals are the first signals $S_0, S_1, S_2, S_3$. It is necessary to determine whether to invert the first signals $S_0, S_1, S_2, S_3$ in the current clock cycle according to the level relationship between a level state of the adjusted first signals $S_0', S_1', S_2', S_3'$ in the previous clock cycle and a level state of the first signals $S_0, S_1, S_2, S_3$ in the current clock cycle.

The first signals $S_0, S_1, S_2, S_3$ in the current clock cycle are inverted to correspondingly obtain the second signals $S_{0\_0}, S_{1\_1}, S_{2\_2}, S_{3\_3}$. Specifically, in the current clock cycle, the first signal $S_0$ at a high level is inverted to the second signal $S_{0\_0}$ at a low level, the first signal $S_1$ at a low level is inverted to the second signal $S_{1\_1}$ at a high level, the first signal $S_2$ at a low level is inverted to the second signal $S_{2\_2}$ at a high level, the first signal $S_3$ at a high level is inverted to the second signal $S_{3\_3}$ at a low level.

The adjusted first signal $S_0'$ is at a high level in the previous clock cycle (i.e., $L_{01}$ is logic "1", where $L_{01}$ represents a logic value of the adjusted first signal $S_0'$ in the previous clock cycle) and the first signal $S_0$ is at a high level in the current clock cycle (i.e., $L_{02}$ is logic "1", where $L_{02}$ represents a logic value of the first signal $S_0$ in the current clock cycle), the control signal $C_0=L_{02}\oplus L_{01}=0$, and the zeroth branch that receives the voltage value $V_0$ ($V_0$ represents a voltage value of the first signal $S_0$ in the current clock cycle) is disconnected, i.e., the zeroth branch does not receive the voltage value $V_0$ in the current clock cycle.

The adjusted first signal $S_1'$ is at a low level in the previous clock cycle (i.e., $L_{11}$ is logic "0", where $L_{11}$ represents a logic value of the adjusted first signal $S_1'$ in the previous clock cycle) and the first signal $S_1$ is at a low level in the current clock cycle (i.e., $L_{12}$ is logic "0", where $L_{12}$ represents a logic value of the first signal $S_1$ in the current clock cycle), the control signal $C_1=L_{12}\oplus L_{11}=0$, and the first branch that receives the voltage value $V_1$ ($V_1$ represents a voltage value of the first signal $S_0$ in the current clock cycle) is disconnected, i.e., the first branch does not receive the voltage value $V_1$ in the current clock cycle.

The adjusted first signal $S_2'$ is at a low level in the previous clock cycle (i.e., $L_{21}$ is logic "0", where $L_{21}$ represents a logic value of the adjusted first signal $S_2'$ in the previous clock cycle) and the first signal $S_2$ is at a low level in the current clock cycle (i.e., $L_{22}$ is logic "0", where $L_{22}$ represents a logic value of the first signal $S_2$ in the current clock cycle), the control signal $C_2=L_{22}\oplus L_{21}=0$, and the second branch that receives the voltage value $V_2$ ($V_2$ represents a voltage value of the first signal $S_2$ in the current clock cycle) is disconnected, i.e., the second branch does not receive the voltage value $V_2$ in the current clock cycle.

The adjusted first signal $S_3'$ is at a low level in the previous clock cycle (i.e., $L_{31}$ is logic "0", where $L_{31}$ represents a logic value of the adjusted first signal $S_3'$ in the previous clock cycle) and the first signal $S_3$ is at a high level in the current clock cycle (i.e., $L_{32}$ is logic "1", where $L_{32}$ represents a logic value of the first signal $S_3$ in the current clock cycle), the control signal $C_3=L_{32}\oplus L_{31}=1$, the third branch that receives the voltage value $V_3$ ($V_3$ represents a voltage value of the first signal $S_3$ in the current clock cycle) conducts, and a current flowing through the resistor $R_{13}$ in the current clock cycle is $$\frac{V_3 - V_{O1}}{R}.$$

When the clock signal CLK undergoes level transition at the current rising edge of the clock signal CLK (i.e., $L_{41}$ is logic "0", $L_{42}$ is logic "1", where $L_{41}$ represents a logic value transmitted right before the current rising edge of the clock signal CLK, and $L_{42}$ represents a logic value transmitted right after the current rising edge of the clock signal CLK), the control signal $C_4 = L_{42} \oplus L_{41} = 1$, the fourth branch that receives the voltage value $V_4$ ($V_4$ represents a voltage value of the clock signal CLK at the current rising edge) conducts, and a current flowing through the resistor $R_{14}$ in the current clock cycle is $$\frac{V_4 - V_{O1}}{R}.$$

Because the sum of the currents flowing through the third and fourth branches is zero $$\left(\text{i.e., } \frac{V_3 - V_{O1}}{R} + \frac{V_4 - V_{O1}}{R} = 0\right), V_{O1} = \frac{V_3 + V_4}{2}.$$

It can be seen that the first indicating voltage $V_{O1}$ is an average value of the input voltages of the third and fourth branches, which conduct. Further, the greater the value of the first indicating voltage $V_{O1}$ is, the greater the number of low-level adjusted first signals $S_i'$ in the previous clock cycle that transition into high-level first signals $S_i$ in the current clock cycle is.

The adjusted first signal $S_0'$ is at a high level in the previous clock cycle (i.e., $L_{01}'$ is logic "1", where $L_{01}'$ represents a logic value of the adjusted first signal $S_0'$ in the previous clock cycle) and the second signal $S_{0\_0}$ is at a low level in the current clock cycle (i.e., $L_{02}'$ is logic "0", where $L_{02}'$ represents a logic value of the second signal $S_{0\_0}$ in the current clock cycle), the control signal $C_0' = L_{01}' \oplus L_{02}' = 1$, the zeroth branch that receives the voltage value $V_0'$ ($V_0'$ represents a voltage value of the second signal $S_{0\_0}$ in the current clock cycle) conducts, and a current flowing through the resistor $R_{20}$ $$\frac{V_0' - V_{O2}}{R}.$$

The adjusted first signal $S_i'$ is at a low level in the previous clock cycle (i.e., $L_{11}'$ is logic "0", where $L_{11}'$ represents a logic value of the adjusted first signal $S_0'$ in the previous clock cycle) and the second signal $S_{1\_1}$ is at a high level in the current clock cycle (i.e., $L_{12}'$ is logic "1", where $L_{12}'$ represents a logic value of the second signal $S_{1\_1}$ in the current clock cycle), the control signal $C_1' = L_{12}' \oplus L_{11}' = 1$, the first branch that receives the voltage value $V_1'$ ($V_1'$ represents a voltage value of the second signal $S_{1\_1}$ in the current clock cycle) conducts, and a current flowing through the resistor $R_{21}$ is $$\frac{V_1' - V_{O2}}{R}.$$

The adjusted first signal $S_2'$ is at a low level in the previous clock cycle (i.e., $L_{21}'$ is logic "0", where $L_{21}'$ represents a logic value of the adjusted first signal $S_2'$ in the previous clock cycle) and the second signal $S_{2\_2}$ is at a high level in the current clock cycle (i.e., $L_{22}'$ is logic "1", where $L_{22}'$ represents a logic value of the second signal $S_{2\_2}$ in the current clock cycle), the control signal $C_2' = L_{22}' \oplus L_{21}' = 1$, the second branch that receives the voltage value $V_2'$ ($V_2'$ represents a voltage value of the second signal $S_{2\_2}$ in the current clock cycle) conducts, and a current flowing through the resistor $R_{22}$ is $$\frac{V_2' - V_{O2}}{R}.$$

The adjusted first signal $S_3'$ is at a low level in the previous clock cycle (i.e., $L_{31}'$ is logic "0", where $L_{31}'$ represents a logic value of the adjusted first signal $S_3'$ in the previous clock cycle) and the second signal $S_{3\_3}$ is at a low level in the current clock cycle (i.e., $L_{32}'$ is logic "0", where $L_{32}'$ represents a logic value of the second signal $S_{3\_3}$ in the current clock cycle), the control signal $C_3' = L_{32}' \oplus L_{31}' = 0$, and the third branch that receives the voltage value $V_3'$ ($V_3'$ represents a voltage value of the second signal $S_{3\_3}$ in the current clock cycle) is disconnected.

When the clock signal CLK undergoes level transition at the current rising edge of the clock signal CLK (i.e., $L_{41}'$ is logic "0", $L_{42}'$ is logic "1", where $L_{41}'$ represents a logic value transmitted right before the rising edge of the clock signal CLK, and $L_{42}'$ represents a logic value transmitted right after the rising edge of the clock signal CLK), the control signal $C_4' = L_{42}' \oplus L_{41}' = 1$, the fourth branch that receives the voltage value $V_4'$ ($V_4'$ represents a voltage value of the clock signal CLK at the current rising edge of the clock signal CLK) conducts, and a current flowing through the resistor $R_{24}$ is $$\frac{V_4' - V_{O2}}{R}.$$

Because the sum of the currents flowing through the zeroth, the first, the second, and the fourth branches is zero $$\left(\text{i.e., } \frac{V_0' - V_{O2}}{R} + \frac{V_1' - V_{O2}}{R} + \frac{V_2' - V_{O2}}{R} + \frac{V_4' - V_{O2}}{R} = 0\right),$$

$$V_{O2} = \frac{V_0' + V_1' + V_2' + V_4'}{4}.$$

It can be seen that the second indicating voltage $V_{O2}$ is an average value of the input voltages of the zeroth, the first, the second, and the fourth branches, which conduct. From the above formula, it can be seen that the greater the value of the second indicating voltage $V_{O2}$ is, the greater the number of low-level adjusted first signal $S_i'$ in the previous clock cycle that transition into high-level second signal $S_{i\_i}$ in the current clock cycle is, and vice versa. Because the second signals $S_{0\_0}, S_{1\_1}, \ldots, S_{(n-1)\_(n-1)}$ in the current clock cycle are obtained by inverting the first signals $S_0, S_1, S_2, S_3$, the greater the second indicating voltage $V_{O2}$ is, the greater the number of low-level adjusted first signals $S_i'$ in the previous clock cycle that transition into low-level first signals $S_i$ in the current clock cycle is.

The first reference voltage $V_H$ is the upper limit of the preset slew rate range, and the second reference voltage $V_L$ is the lower limit of the preset slew rate range. Users can set the first reference voltage $V_H$ and the second reference voltage $V_L$ according to their needs for the slew rate range.

In the following, it is assumed that $V_{O1} > V_H$, $V_L < V_{O2} < V_H$.

When $V_{O1} > V_H$, the comparator $CP_1$ outputs a high level (i.e., $V_{comp1}=1$), the comparator $CP_2$ outputs a low level (i.e., $V_{comp2}=0$), and the XOR gate XOR1 outputs a high level (i.e., $V_{out1}=1$). This situation indicates that the number of low-level adjusted first signals $S_i'$ in the previous clock cycle that transition into high-level second signals $S_{i\_i}$ in the current clock cycle is greater than the number of high-level adjusted first signal $S_i'$ in the previous clock cycle that transition into low-level second signals $S_{i\_i}$ in the current clock cycle. That is, $V_{out1}=1$ indicates that the actual slew rate range of the first signals $S_0, S_1, S_2, S_3$ to be output in the current clock cycle exceeds the preset slew rate range.

When $V_L < V_{O2} < V_H$, the comparator $CP_3$ outputs a high level (i.e., $V_{comp3}=1$), the comparator $CP_4$ outputs a high level (i.e., $V_{comp4}=1$), and the AND gate AND1 outputs a high level (i.e., $V_{out2}=1$). This situation indicates that the number of low-level adjusted first signal $S_i'$ in the previous clock cycle that transition into high-level second signals $S_{i\_i}$ in the current clock cycle is basically equal to the number of high-level adjusted first signals $S_i'$ in the previous clock cycle that transition into low-level second signals $S_{i\_i}$ in the current clock cycle, and it also further indicates that the number of low-level adjusted first signals $S_i'$ in the previous clock cycle that transition into low-level first signals $S_0, S_1, \ldots, S_{(n-1)}$ in the current clock cycle is basically equal to the number of high-level adjusted first signal $S_i'$ in the previous clock cycle that transition into high-level first signals $S_i$ in the current clock cycle. That is, $V_{out2}=1$ indicates that the actual slew rate range of the second signals $S_{0\_0}, S_{1\_1}, S_{2\_2}, S_{3\_3}$ in the current clock cycle is within the preset slew rate range.

When $V_{out1}=1$ and $V_{out2}=1$, the AND gate AND2 outputs the third operation result $V_{out3}$ at a high level (i.e., $V_{out3}=1$), to indicate that the first signals $S_0, S_1, \ldots, S_{(n-1)}$ in the current clock cycle are to be inverted.

When $V_{out3}=1$, the NMOS transistor $N_3$ and the PMOS transistor $P_2$ are turned on, and the first signals $S_0, S_1, S_2, S_3$ in the current clock cycle are inverted by the inverter composed of the PMOS transistor $P_3$ and the NMOS transistor $N_2$ to generate the adjusted first signals $S_0', S_1', S_2', S_3'$. That is, the adjusted first signals $S_0', S_1', S_2', S_3'$ are obtained by inverting the first signals $S_0, S_1, S_2, S_3$ in the current clock cycle.

The signal output circuit 120 outputs the adjusted first signals $S_0', S_1', S_2', S_3'$, and also outputs the indicating signal $S_m$ at a high level which indicates that the first signals $S_0, S_1, S_2, S_3$ are inverted in the current clock cycle.

It can be seen that the slew-rate control system of the embodiment determines whether it is necessary to invert the multiple first signals in the current clock cycle to obtain the multiple adjusted first signals in the current clock cycle by determining the level relationship between a level state of each adjusted first signal in the previous clock cycle and a level state of the corresponding first signal in the current clock cycle, and the level relationship between a level state of each adjusted first signal in the previous clock cycle and a level state of the corresponding second signal in the current clock cycle. The above adjustment ensures that the slew rate range of the multiple adjusted first signals is within the preset slew rate range, thereby reducing the power consumption of the signal output circuit 120.

Figure 8:
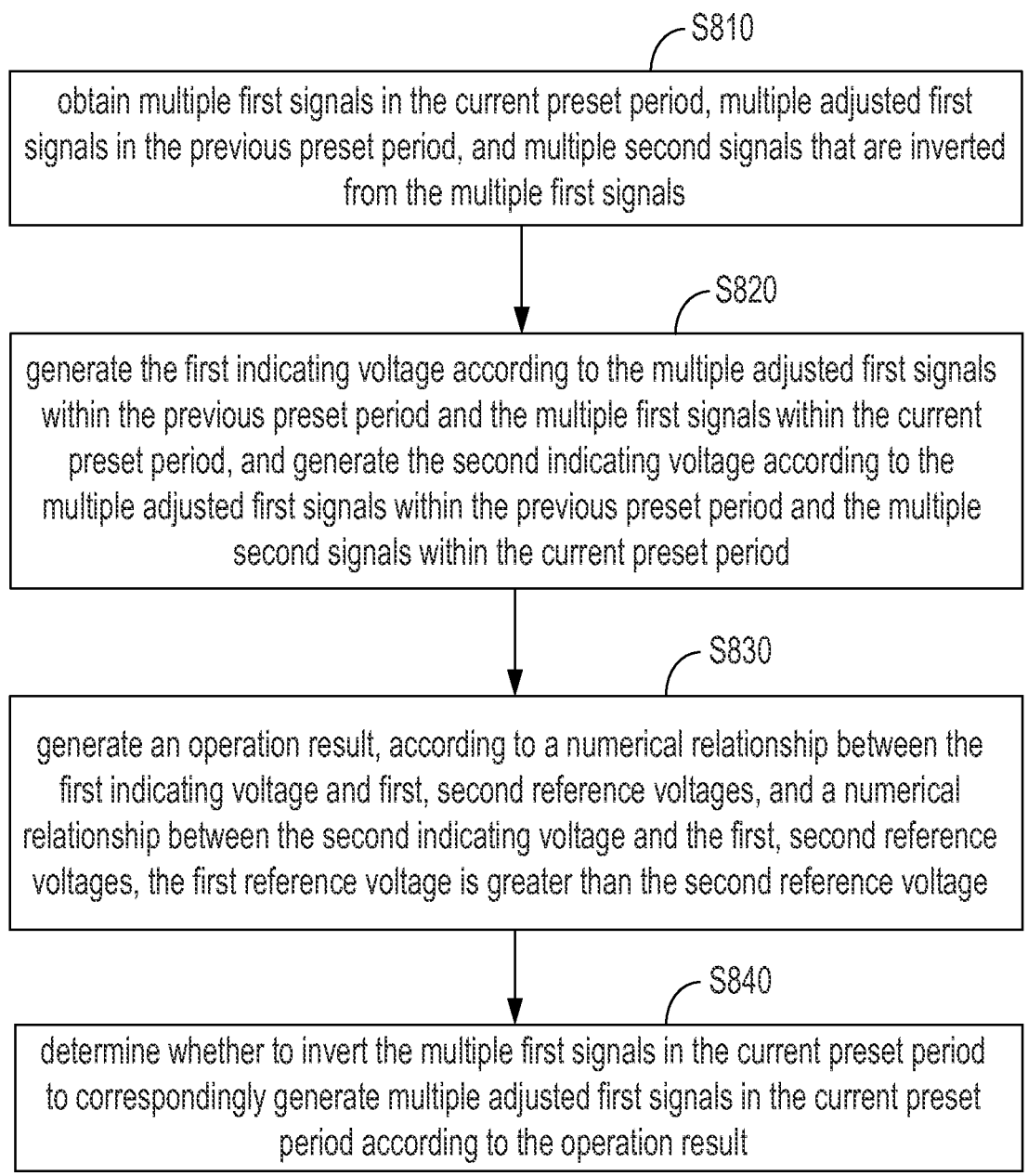
FIG. 8 shows a flowchart of a slew-rate control method according to an embodiment of the disclosure.

As shown in FIG. 8, the disclosure also provides a slew-rate control method, which is applied to the slew-rate control circuit 110. The slew-rate control circuit 110 includes a proportional calculation circuit 111, a logic operation circuit 112 coupled to the proportional calculation circuit 111, and an output adjustment circuit 113 coupled to the logic operation circuit 112. The slew-rate control method includes steps S810-S840.

Step S810, obtaining multiple first signals $S_0, S_1, \ldots, S_{(n-1)}$ in the current preset period, multiple adjusted first signals $S_0', S_1', \ldots, S_{(n-1)}'$ in the previous preset period, and multiple second signals $S_{0\_0}, S_{1\_1}, \ldots, S_{(n-1)\_(n-1)}$ that are inverted from the multiple first signals $S_0, S_1, \ldots, S_{(n-1)}$.

Step S820, generating the first indicating voltage $V_{O1}$ according to the multiple adjusted first signals $S_0', S_1', \ldots, S_{(n-1)}'$ within the previous preset period and the multiple first signals $S_0, S_1, \ldots, S_{(n-1)}$ within the current preset period, and generating the second indicating voltage $V_{O2}$ according to the multiple adjusted first signals $S_0', S_1', \ldots, S_{(n-1)}'$ within the previous preset period and the multiple second signals $S_{0\_0}, S_{1\_1}, \ldots, S_{(n-1)\_(n-1)}$ within the current preset period. The first indicating voltage $V_{O1}$ indicates a first numerical relationship between the number of low-level adjusted first signals within the previous preset period that respectively transition into high-level first signals within the current preset period, and the number of high-level adjusted first signals within the previous preset period that respectively transition into low-level first signals within the current preset period. The second indicating voltage $V_{O2}$ indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period.

Step S830, generating an operation result, according to a numerical relationship between the first indicating voltage $V_{O1}$ and first, second reference voltages $V_H, V_L$, and a numerical relationship between the second indicating voltage $V_{O2}$ and the first, second reference voltages $V_H, V_L$. The first reference voltage $V_H$ is greater than the second reference voltage $V_L$.

Step S840, determining whether to invert the multiple first signals $S_0, S_1, \ldots, S_{(n-1)}$ in the current preset period to correspondingly generate multiple adjusted first signals $S_0', S_1', \ldots, S_{(n-1)}'$ in the current preset period according to the operation result.

The slew-rate control method determines whether it is necessary to invert multiple first signals in the current preset period to obtain multiple adjusted first signals in the current preset period by determining the level relationship between a level state of each adjusted first signal in the previous preset period and a level state of the corresponding first signal in the current preset period, and the level relationship between a level state of each adjusted first signal in the previous preset period and the level state of the corresponding second signal in the current preset period. The above method ensures the slew rate range of multiple adjusted first signals within the current preset period is within the preset slew rate range, thereby reducing the power consumption.

It will be obvious to those skilled in the art that changes and modifications may be made, and therefore, the aim in the appended claims is to cover all such changes and modifications.

What is claimed is:

1. A slew-rate control circuit, comprising:
a proportional calculation circuit, configured to parallelly receive a plurality of first signals within a current preset period, generate a first indicating voltage according to a plurality of adjusted first signals within a previous preset period and the plurality of first signals within the current preset period, and generate a second indicating voltage according to the plurality of adjusted first signals within the previous preset period and a plurality of second signals that are inverted from the plurality of first signals within the current preset period, wherein the first indicating voltage indicates a first numerical relationship between a number of low-level adjusted first signals within the previous preset period that respectively transition into high-level first signals within the current preset period, and a number of high-level adjusted first signals within the previous preset period that respectively transition into low-level first signals within the current preset period, and the second indicating voltage indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period;
a logic operation circuit, coupled to the proportional calculation circuit, wherein the logic operation circuit is configured to receive the first indicating voltage and the second indicating voltage, and generate an operation result according to a numerical relationship between the first indicating voltage, and first and second reference voltages, and a numerical relationship between the second indicating voltage, and the first and second reference voltages, wherein the first reference voltage is greater than the second reference voltage; and
an output adjustment circuit, coupled to the logic operation circuit, wherein the output adjustment circuit is configured to receive the operation result, and determine whether to invert the plurality of first signals within the current preset period to correspondingly generate a plurality of adjusted first signals within the current preset period according to the operation result.

2. The slew-rate control circuit of claim 1, wherein the first reference voltage is an upper limit of a preset slew rate range, and the second reference voltage is a lower limit of the preset slew rate range.

3. The slew-rate control circuit of claim 1, wherein the proportional calculation circuit comprises:
a first proportional calculation subcircuit, configured to parallelly receive the plurality of first signals within the current preset period, and generate the first indicating voltage according to the first numerical relationship; and
a second proportional calculation subcircuit, configured to parallelly receive the plurality of first signals within the current preset period, invert the plurality of first signals within the current preset period to obtain the plurality of second signals, and generate the second indicating voltage according to the second numerical relationship.

4. The slew-rate control circuit of claim 3, wherein the first proportional calculation subcircuit comprises a plurality of branches,
wherein the plurality of branches are coupled in parallel, and a voltage value of each first signal within the current preset period is input into a respective one of the plurality of branches,
wherein for each of the plurality of branches, after a transition from a corresponding adjusted first signal of a first level state within the previous preset period to a corresponding first signal of a second level state within the current preset period, this branch conducts when the first level state is different from the second level state, at which time the first indicating voltage is generated at a common end of the plurality of branches.

5. The slew-rate control circuit of claim 4, wherein each branch in the plurality of branches of the first proportional calculation subcircuit comprises a PMOS transistor, an NMOS transistor, and a resistor, wherein the PMOS transistor and the NMOS transistor are coupled in parallel, a first end of the parallel-coupled PMOS transistor and the NMOS transistor receives a voltage value of the corresponding first signal within the current preset period, and a second end of the parallel-coupled PMOS transistor and the NMOS transistor is coupled to the resistor, wherein the NMOS transistor and the PMOS transistor are turned on when the first level state is different from the second level state.

6. The slew-rate control circuit of claim 3, wherein the second proportional calculation subcircuit comprises a plurality of branches,
wherein the plurality of branches are coupled in parallel, and a voltage value of each second signal within the current preset period is input into a respective one of the plurality of branches,
wherein for each of the plurality of branches, after a transition from a corresponding adjusted first signal of a first level state within the previous preset period to a corresponding second signal of a third level state within the current preset period, this branch conducts when the first level state is different from the third level state, at which time the second indicating voltage is generated at a common end of the plurality of branches.

7. The slew-rate control circuit of claim 6, wherein each branch in the plurality of branches of the second proportional calculation subcircuit comprises a PMOS transistor, an NMOS transistor, and a resistor, wherein the PMOS transistor and the NMOS transistor are coupled in parallel, a first end of the parallel-coupled PMOS transistor and the NMOS transistor receives a voltage value of the corresponding second signal within the current preset period, and a second end of the parallel-coupled PMOS transistor and the NMOS transistor is coupled to the resistor, wherein the NMOS transistor and the PMOS transistor are turned on when the first level state is different from the third level state.

8. The slew-rate control circuit of claim 1, wherein the logic operation circuit comprises:
a first operation circuit, coupled to the proportional calculation circuit, configured to generate a first initial operation result according to the numerical relationship between the first indicating voltage, and the first and second reference voltages;
a second operation circuit, coupled to the proportional calculation circuit, configured to generate a second initial operation result according to the numerical relationship between the second indicating voltage, and the first and second reference voltages; and a third operation circuit, coupled to the first operation circuit and the second operation circuit, configured to receive the first initial operation result and the second initial operation result, perform a logic operation on the first initial operation result and the second initial operation result, and generate the operation result that indicates whether to invert the plurality of first signals within the current preset period.

9. The slew-rate control circuit of claim 8, wherein
when the first indicating voltage is greater than the first reference voltage or less than the second reference voltage, the first initial operation result is in a first logic state; and
when the first indicating voltage is not greater than the first reference voltage and not less than the second reference voltage, the first initial operation result is in a second logic state, wherein the first logic state is different from the second logic state.

10. The slew-rate control circuit of claim 8, wherein
when the second indicating voltage is greater than the first reference voltage or less than the second reference voltage, the second initial operation result is in a third logic state; and
when the second indicating voltage is not greater than the first reference voltage and not less than the second reference voltage, the second initial operation result is in a fourth logic state, wherein the third logic state is different from the fourth logic state.

11. The slew-rate control circuit of claim 8, wherein the first operation circuit comprises:
a first comparator, wherein a non-inverting input end of the first comparator receives the first indicating voltage, an inverting input end of the first comparator receives the first reference voltage, and an output end of the first comparator outputs a first comparison result;
a second comparator, wherein a non-inverting input end of the second comparator receives the second reference voltage, an inverting input end of the second comparator receives the second indicating voltage, and an output end of the second comparator outputs a second comparison result; and
an XOR gate, wherein the XOR gate performs an XOR operation on the first comparison result and the second comparison result, and generates the first initial operation result.

12. The slew-rate control circuit of claim 8, wherein the second operation circuit comprises:
a third comparator, wherein a non-inverting input end of the third comparator receives the first reference voltage, an inverting input end of the third comparator receives the second indicating voltage, and an output end of the third comparator outputs a third comparison result;
a fourth comparator, wherein a non-inverting input end of the fourth comparator receives the second indicating voltage, an inverting input end of the fourth comparator receives the second reference voltage, and an output end of the fourth comparator outputs a fourth comparison result; and
a first AND gate, wherein the first AND gate performs an AND operation on the third comparison result and the fourth comparison result, and generates the second initial operation result.

13. The slew-rate control circuit of claim 8, wherein the third operation circuit comprises:
a second AND gate, coupled to the first operation circuit and the second operation circuit, configured to perform an AND operation on the first initial operation result and the second initial operation result, and generate the operation result.

14. The slew-rate control circuit of claim 8, wherein the operation result in a fifth logic state indicates that that the plurality of first signals within the current preset period are to be inverted; the operation result in a sixth logic state indicates that the plurality of first signals within the current preset period are not to be inverted, wherein the fifth logic state is different from the sixth logic state.

15. The slew-rate control circuit of claim 1, wherein the output adjustment circuit comprises:
a first PMOS transistor and a first NMOS transistor coupled in parallel; and
a second PMOS transistor, a third PMOS transistor, a second NMOS transistor, and a third NMOS transistor coupled in series;
wherein the operation result is input to a control end of the first PMOS transistor and a control end of the third NMOS transistor;
wherein the plurality of first signals are input to a control end of the third PMOS transistor, a control end of the second NMOS transistor, and a common node of the parallel-coupled first PMOS transistor and first NMOS transistor; and
wherein an inverted operation result is input to a control end of the first NMOS transistor and a control end of the second PMOS transistor.

16. A slew-rate control method, comprising:
obtaining, using a proportional calculation circuit, a plurality of first signals within a current preset period, a plurality of adjusted first signals within a previous preset period, and a plurality of second signals that are inverted from the plurality of first signals within the current preset period;
generating, using the proportional calculation circuit, a first indicating voltage according to the plurality of adjusted first signals within the previous preset period and the plurality of first signals within the current preset period, and generating a second indicating voltage according to the plurality of adjusted first signals within the previous preset period and the plurality of second signals within the current preset period, wherein the first indicating voltage indicates a first numerical relationship between a number of low-level adjusted first signals within the previous preset period that respectively transition into high-level first signals within the current preset period, and a number of high-level adjusted first signals within the previous preset period that respectively transition into low-level first signals within the current preset period, and the second indicating voltage indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period;
generating, using a logic operation circuit, an operation result according to a numerical relationship between the first indicating voltage, and first and second reference voltages, and a numerical relationship between the second indicating voltage, and the first and second reference voltages, wherein the first reference voltage is greater than the second reference voltage; and determining, using an output adjustment circuit, whether to invert the plurality of first signals within the current preset period to correspondingly generate a plurality of adjusted first signals within the current preset period according to the operation result.

17. The slew-rate control method of claim 16, wherein the proportional calculation circuit comprises a first proportional calculation subcircuit and a second proportional calculation subcircuit; wherein the slew-rate control method further comprises:
receiving, using the first proportional calculation subcircuit, the plurality of first signals within the current preset period, and generating the first indicating voltage according to the first numerical relationship; and
receiving, using the second proportional calculation subcircuit, the plurality of first signals within the current preset period, inverting the plurality of first signals within the current preset period to obtain the plurality of second signals, and generating the second indicating voltage according to the second numerical relationship.

18. The slew-rate control method of claim 16, wherein the logic operation circuit comprises a first operation circuit, a second operation circuit, and a third operation circuit, a step of generating the operation result comprises:
generating, using the first operation circuit, a first initial operation result according to the numerical relationship between the first indicating voltage, and the first and second reference voltages;
generating, using the second operation circuit, a second initial operation result according to the numerical relationship between the second indicating voltage, and the first and second reference voltages; and
performing, using the third operation circuit, a logic operation on the first initial operation result and the second initial operation result, and generating the operation result that indicates whether to invert the plurality of first signals within the current preset period.

19. A slew-rate control system, comprising:
a slew-rate control circuit, configured to parallelly receive a plurality of first signals within a current preset period, determine whether to invert the plurality of first signals within the current preset period to generate a plurality of adjusted first signals within the current preset period, according to a level relationship between a level state of each adjusted first signal in a previous preset period and a level state of a corresponding first signal in the current preset period, and a level relationship between a level state of each adjusted first signal in the previous preset period and a level state of a corresponding second signal in the current preset period, wherein a plurality of second signals are obtained by inverting the plurality of first signals within the current preset period; and
a signal output circuit, coupled to the slew-rate control circuit, configured to parallelly output the plurality of adjusted first signals within the current preset period.

20. The slew-rate control system of claim 19, wherein the slew-rate control circuit comprises:
a proportional calculation circuit, configured to parallelly receive the plurality of first signals within the current preset period, generate a first indicating voltage according to a plurality of adjusted first signals within the previous preset period and the plurality of first signals within the current preset period, and generate a second indicating voltage according to the plurality of adjusted first signals within the previous preset period and the plurality of second signals within the current preset period, wherein the first indicating voltage indicates a first numerical relationship between the number of low-level adjusted first signals within the previous preset period that respectively transition into high-level first signals within the current preset period, and the number of high-level adjusted first signals within the previous preset period that respectively transition into low-level first signals within the current preset period, and the second indicating voltage indicates a second numerical relationship between the number of low-level adjusted first signals within the previous preset period that respectively transition into high-level second signals within the current preset period, and the number of high-level adjusted first signals within the previous preset period that respectively transition into low-level second signals within the current preset period;
a logic operation circuit, coupled to the proportional calculation circuit, configured to generate an operation result according to a numerical relationship between the first indicating voltage, and first and second reference voltages, and a numerical relationship between the second indicating voltage, and the first and second reference voltages, wherein the first reference voltage is greater than the second reference voltage; and
an output adjustment circuit, coupled to the logic operation circuit, configured to receive the operation result, and determine whether to invert the plurality of first signals within the current preset period to correspondingly generate the plurality of adjusted first signals within the current preset period according to the operation result.

* * * * *